(12) United States Patent
Kim et al.

(10) Patent No.: US 10,026,724 B2
(45) Date of Patent: Jul. 17, 2018

(54) SEMICONDUCTOR PACKAGE AND METHOD OF MANUFACTURING THE SAME

(71) Applicant: Samsung Electronics Co., Ltd., Suwon-si (KR)

(72) Inventors: Ji-hwang Kim, Cheonan-si (KR); Jong-bo Shim, Asan-si (KR); Sang-uk Han, Hwaseong-si (KR); Cha-jea Jo, Yongin-si (KR); Gun-ho Chang, Yongin-si (KR)

(73) Assignee: SAMSUNG ELECTRONICS CO., LTD., Samsung-ro, Yeongton-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/444,277

(22) Filed: Feb. 27, 2017

(65) Prior Publication Data

US 2018/0006006 A1    Jan. 4, 2018

(30) Foreign Application Priority Data

Jun. 30, 2016  (KR) .......................... 10-2016-0082973

(51) Int. Cl.
  *H01L 25/00*    (2006.01)
  *H01L 23/00*    (2006.01)
  (Continued)

(52) U.S. Cl.
  CPC .......... *H01L 25/50* (2013.01); *H01L 23/3185* (2013.01); *H01L 24/05* (2013.01); *H01L 24/16* (2013.01); *H01L 24/17* (2013.01); *H01L 24/73* (2013.01); *H01L 25/0657* (2013.01); *H01L 2224/0557* (2013.01); *H01L 2224/13025* (2013.01); *H01L 2224/16146* (2013.01); *H01L 2224/17181* (2013.01); *H01L 2224/73204* (2013.01); *H01L 2225/06513* (2013.01); *H01L 2225/06517* (2013.01);
  (Continued)

(58) Field of Classification Search
  None
  See application file for complete search history.

(56) References Cited

U.S. PATENT DOCUMENTS 8,455,301 B2 * 6/2013 Lee .................. H01L 21/561
                                              257/622
8,575,724 B2   11/2013 Bhagath et al.
(Continued)

FOREIGN PATENT DOCUMENTS

KR    10-2011-0004114    1/2011
KR    10-1054492         9/2011

*Primary Examiner* — Mamadou Diallo
(74) *Attorney, Agent, or Firm* — Muir Patent Law, PLLC

(57) ABSTRACT

A method of manufacturing a semiconductor package includes forming at least two partial package chip stacks, each partial package chip stack including at least two semiconductor chips each including a plurality of through substrate vias (TSVs), and including a first mold layer surrounding side surfaces of the at least two semiconductor chips, and sequentially mounting the at least two partial package chip stacks on a package substrate in a direction vertical to a top surface of the package substrate, such that the at least two partial package chip stacks include a first partial package chip stack and a second partial package chip stack directly connected to the first partial package chip stack.

20 Claims, 21 Drawing Sheets

(51) Int. Cl.
*H01L 23/31* (2006.01)
*H01L 25/065* (2006.01)

(52) U.S. Cl.
CPC .............. *H01L 2225/06541* (2013.01); *H01L 2225/06565* (2013.01); *H01L 2225/06568* (2013.01); *H01L 2225/06596* (2013.01); *H01L 2225/1023* (2013.01); *H01L 2225/1058* (2013.01)

(56) References Cited

U.S. PATENT DOCUMENTS

| | | | |
|---|---|---|---|
| 8,637,350 B2* | 1/2014 | Ahn | H01L 21/76898 |
| | | | 257/E21.511 |
| 8,828,798 B2 | 9/2014 | England et al. | |
| 8,901,727 B2* | 12/2014 | Kang | H01L 21/563 |
| | | | 257/686 |
| 9,123,552 B2 | 9/2015 | Keeth et al. | |
| 9,165,916 B2* | 10/2015 | Chung | H01L 25/50 |
| 9,601,465 B2* | 3/2017 | Kang | H01L 24/97 |
| 9,853,012 B2* | 12/2017 | Chung | H01L 25/0657 |
| 2011/0033980 A1 | 2/2011 | Chung | |
| 2012/0217654 A1 | 8/2012 | Shin et al. | |
| 2015/0001685 A1* | 1/2015 | Chung | H01L 21/486 |
| | | | 257/621 |
| 2015/0102468 A1 | 4/2015 | Kang et al. | |
| 2015/0115982 A1 | 4/2015 | Chen et al. | |
| 2015/0279881 A1 | 10/2015 | Shizukuishi | |

* cited by examiner

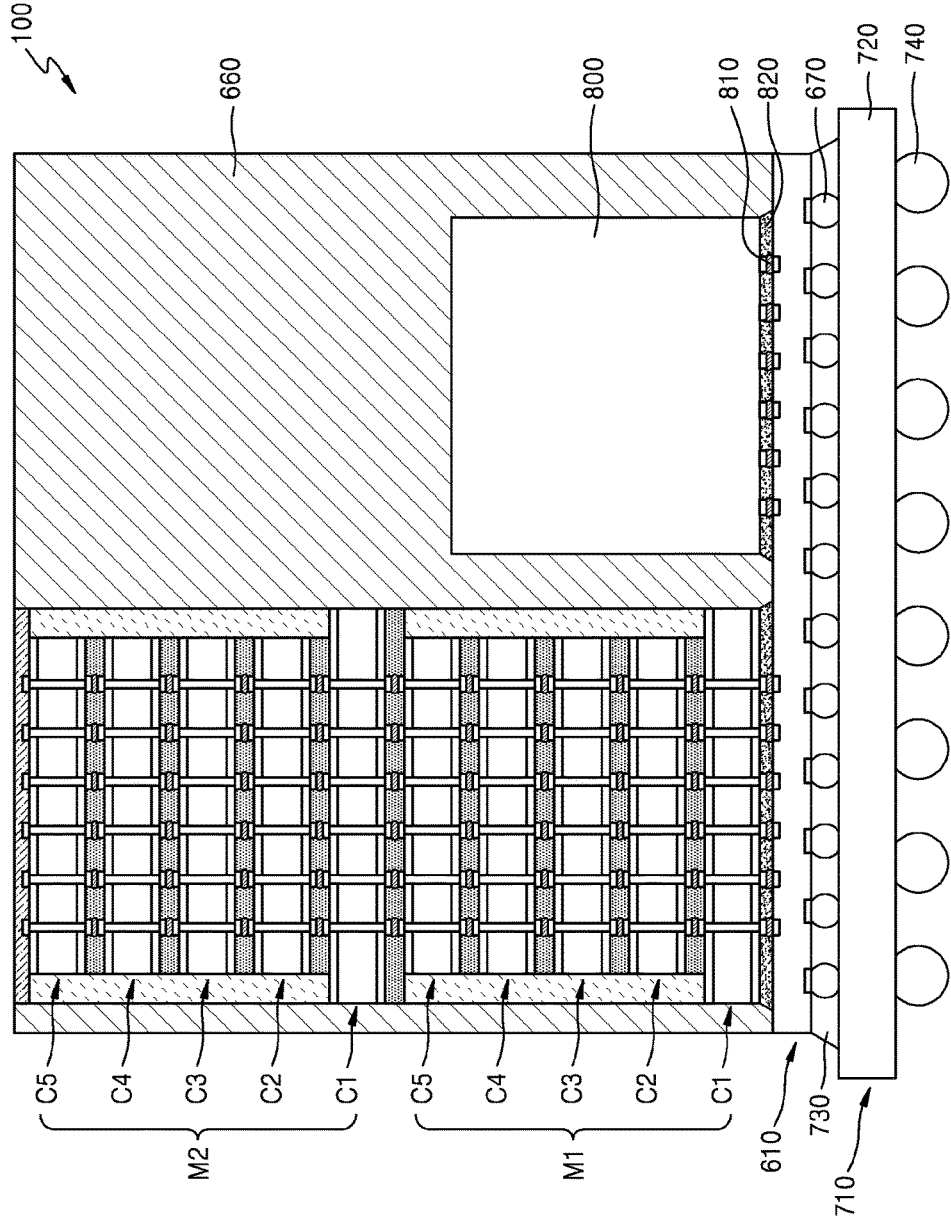

SEMICONDUCTOR PACKAGE AND METHOD OF MANUFACTURING THE SAME

CROSS-REFERENCE TO RELATED APPLICATION

This application claims the benefit of priority under 35 U.S.C. 119 to Korean Patent Application No. 10-2016-0082973, filed on Jun. 30, 2016, in the Korean Intellectual Property Office, the disclosure of which is incorporated herein in its entirety by reference.

BACKGROUND

The present disclosure relates to a semiconductor package and a method of manufacturing the same, and more particularly, to a semiconductor package including a through substrate via (TSV) and a method of manufacturing the same.

As the electronic industry rapidly advances and the requirements of users increase, electronic devices are becoming more and more miniaturized and multi-functioned. Accordingly, semiconductor packages where a plurality of semiconductor chips each including a TSV are stacked in a vertical direction have been proposed.

SUMMARY

Various disclosed embodiments provide a semiconductor package with improved reliability.

Certain disclosed embodiments also provide a method of manufacturing a semiconductor package, which decreases defects occurring in a process of stacking semiconductor chips.

In certain embodiments, a method includes providing a first sub-package unit including at least two first semiconductor chips, which are vertically stacked, and a first mold layer surrounding side surfaces of the at least two first semiconductor chips; and providing a second sub-package unit including at least two second semiconductor chips, which are vertically stacked, and a second mold layer that surrounds side surfaces of the at least two second semiconductor chips and is vertically spaced apart from the first mold layer. The second sub-package unit is disposed on the first sub-package unit. The at least two first semiconductor chips and the at least two second semiconductor chips each include a through substrate via (TSV). In addition, a topmost semiconductor chip of the at least two first semiconductor chips is electrically connected to the bottom-most semiconductor chip of the at least two second semiconductor chips, without a package substrate therebetween. A package substrate is provided, on which the at least two first semiconductor chips and the at least two second semiconductor chips are vertically stacked to form a semiconductor package.

In certain embodiments, a method of manufacturing a semiconductor package includes providing a package substrate, and stacking a plurality of sub-package units on the package substrate along a direction vertical to a top surface of the package substrate by first stacking a first sub-package unit on the package substrate and subsequently stacking a second sub-package unit on the first sub-package unit. Each of the plurality of sub-package units comprises a first buffer chip or logic chip, a first memory chip disposed on the first buffer chip or logic chip, a second memory chip disposed on the first memory chip, and for each sub-package unit, a first mold layer surrounding a side surface of each of the first and second memory chips, wherein each of the first buffer chip, the first memory chip, and the second memory chip includes a through substrate via (TSV). The method further includes performing a reflow process to directly electrically connect the first sub-package unit to the second sub-package unit.

In certain embodiments, a method of manufacturing a semiconductor package includes forming at least two partial package chip stacks, each partial package chip stack including at least two semiconductor chips each including a plurality of through substrate vias (TSVs), and including a first mold layer surrounding sides of the at least two semiconductor chips, and sequentially mounting the at least two partial package chip stacks on a package substrate in a direction vertical to a top of the package substrate, such that the at least two partial package chip stacks include a first partial package chip stack and a second partial package chip stack directly connected to the first partial package chip stack.

BRIEF DESCRIPTION OF THE DRAWINGS

Embodiments of the inventive concept will be more clearly understood from the following detailed description taken in conjunction with the accompanying drawings in which:

FIG. 21 is a cross-sectional view illustrating a semiconductor package according to exemplary embodiments.

DETAILED DESCRIPTION

Figure 1:
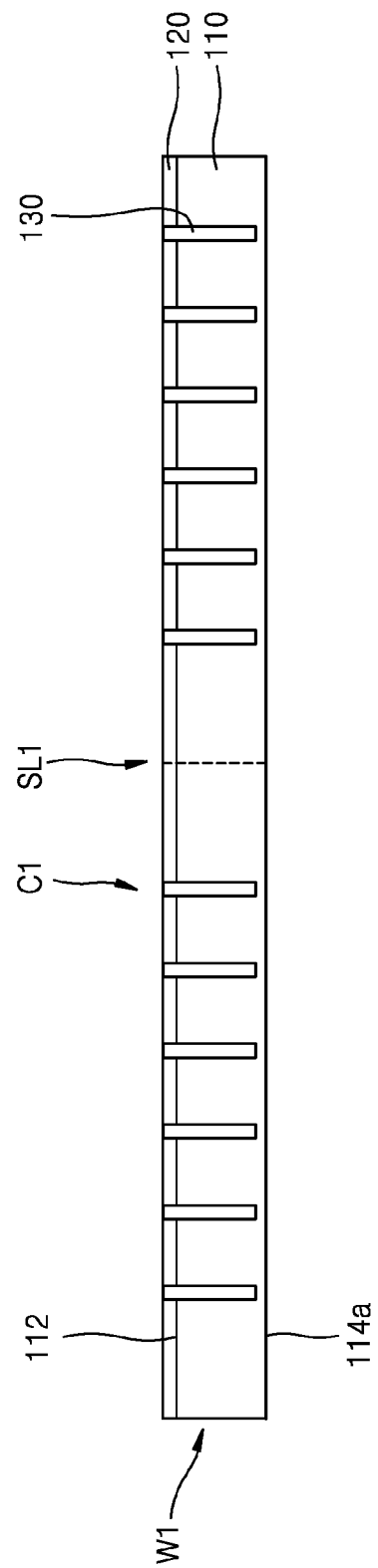
FIGS. 1 to 13 are cross-sectional views illustrating a method of manufacturing a semiconductor package according to exemplary embodiments.

Hereinafter, embodiments will be described in detail with reference to the accompanying drawings. In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

FIGS. 1 to 13 are cross-sectional views illustrating a method of manufacturing a semiconductor package 100, according to exemplary embodiments.

Referring to FIG. 1, a first semiconductor wafer W1 may be prepared. The first semiconductor wafer W1 may include a plurality of first semiconductor chips C1 which are distinguished from each other by a first scribe lane SL1. The plurality of first semiconductor chips C1 may each include a first semiconductor substrate 110, a first semiconductor device layer 120, and a first through substrate via (TSV) 130. The first semiconductor substrate 110 may include a first surface 112 and a second surface 114a which are opposite to each other. The first semiconductor device layer 120 may be formed on the first surface 112 of the first semiconductor substrate 110. The TSV 130 may be formed to extend through the first semiconductor device layer 120 from the first surface 112 of the first semiconductor substrate 110 to the inside of the first semiconductor substrate 110.

The first semiconductor device layer 120 may include various kinds of a plurality of individual devices, and may be, for example, an integrated circuit device. The plurality of individual devices may include various microelectronic devices, for example, a metal-oxide-semiconductor field effect transistor (MOSFET) such as a complementary metal-insulator-semiconductor (CMOS) transistor, system large scale integration (LSI), an image sensor such as a CMOS imaging sensor (CIS), a micro-electro-mechanical system (MEMS), an active device, a passive device, etc. The first semiconductor device layer 120 may include a plurality of wiring structures for connecting the plurality of individual devices to other wirings formed on the first semiconductor substrate 110. However, the kinds of the plurality of individual devices included in the first semiconductor device layer 120 are not limited to the above-described ones.

The first TSV 130 may extend from the first surface 112 of the first semiconductor substrate 110 to the inside of the first semiconductor substrate 110. At least a portion of the first TSV 130 may have a pillar shape. The first TSV 130 may include a buried conductive layer having a pillar shape, and a barrier layer formed to surround a side surface of the buried conductive layer. A via insulation layer (not shown) may be disposed between the first semiconductor substrate 110 and the first TSV 130. The TSV 130 may include oxide, nitride, carbide, a polymer, or a combination thereof.

In a subsequent process, a portion of the first semiconductor substrate 110 may be removed, and the first TSV 130 may include a conductive material passing through the first semiconductor substrate 110 from which the portion was removed. For example, the first TSV 130 may include the barrier layer and the buried conductive layer which fills the inside of the barrier layer. Alternatively, for example, the first TSV 130 may include the barrier layer, the buried conductive layer filling the inside of the barrier layer, and portions of a metal wiring layer and/or a via plug. The TSV may also pass through the semiconductor device layer 120, and may connect to circuitry within the semiconductor device layer 120 (e.g., to connect to an integrated circuit of the semiconductor device layer 120).

Figure 2:
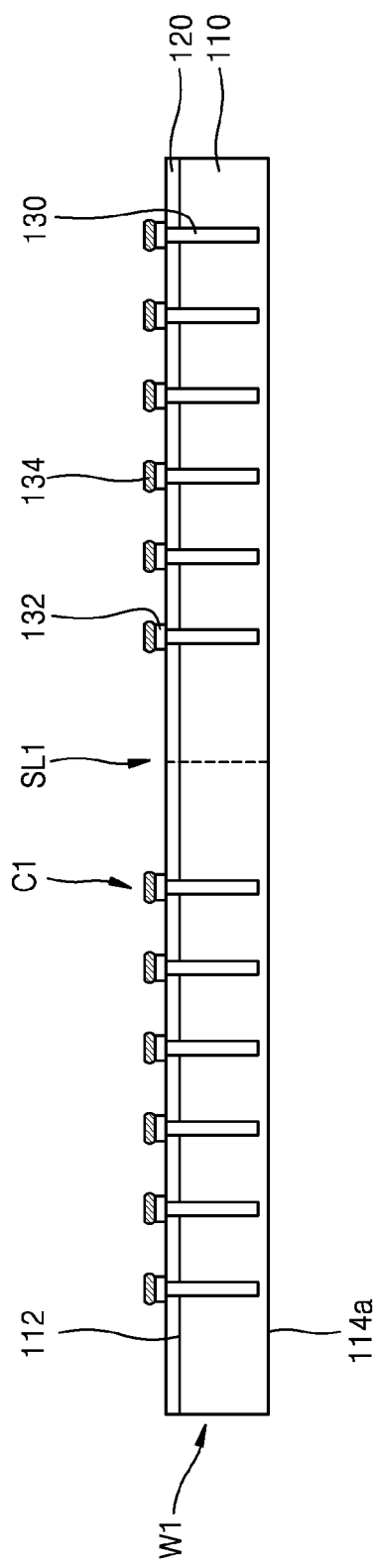

Referring to FIG. 2, a first connection pad 132 electrically connected to the first TSV 130 may be formed on the first semiconductor substrate 110, and a first connection bump 134 may be formed on the first connection pad 132.

Although not shown, the first connection bump 134 may include a pillar layer (not shown) and a solder layer (not shown) disposed on the pillar layer. For example, a mask pattern (not shown) including an opening (not shown) exposing a portion of the first connection pad 132 may be formed on the first semiconductor device layer 120. Subsequently, the pillar layer and the solder layer may be sequentially stacked on the portion of the first connection pad 132 exposed by the mask pattern. For example, the pillar layer and the solder layer may be formed by performing an electroplating process. Subsequently, the mask pattern may be removed, and the solder layer having a convex shape may be formed by reflowing the solder layer through thermal treatment. Although in FIG. 2 the first connection bump 134 is schematically illustrated as having a convex shape, a shape of the first connection bump 134 is not limited to the above-described ones. For example, the first connection bump 134 may be formed so that the pillar layer has a cylindrical shape including a side wall vertical to a top of the first semiconductor device layer 120, and the solder layer substantially has a hemispherical shape on the pillar layer. Also, the pillar layer may be formed in a structure where a plurality of metal layers including different metal materials are stacked.

In exemplary embodiments, the first connection bump 134 may have a horizontal width (for example, a width in a direction parallel to a top of the first semiconductor wafer W1) of about 20 μm to about 100 μm, but is not limited thereto. In some embodiments, the first connection bump 134 may have a horizontal width of about 20 μm to about 60 μm.

Figure 3:
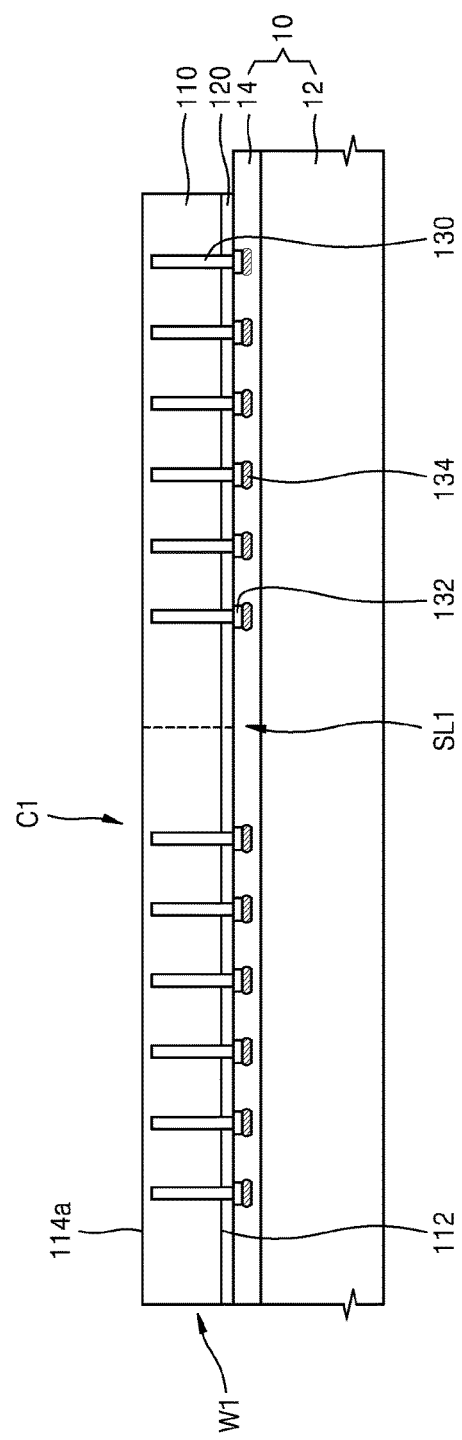

Referring to FIG. 3, the first semiconductor wafer W1, on which the first connection bump 134 is formed, may be attached on a first carrier substrate 10. The first carrier substrate 10 may include a first supporting substrate 12 and a first glue layer 14. The first semiconductor wafer W1 may be attached on the first carrier substrate 10 with the first connection bump 134 facing the first carrier substrate 10. The first connection bump 134 may be surrounded by the first glue layer 14. A portion, which is exposed by not being covered by the first connection bump 134, of the first surface 112 of the first semiconductor substrate 110 may contact the first glue layer 14.

Figure 4:
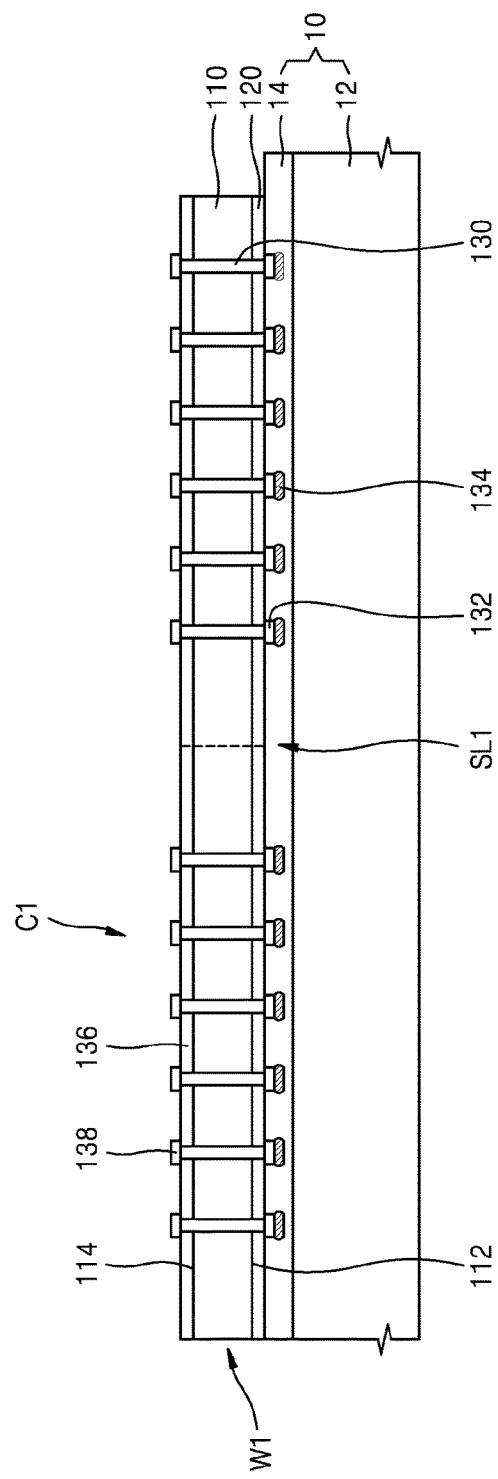

Referring to FIG. 4, the first TSV 130 may be exposed by removing a portion of the first semiconductor substrate 110. The first TSV 130 may be exposed to the second surface 114 of the first semiconductor substrate 110. Since the first TSV 130 is exposed to the second surface 114 of the first semiconductor substrate 110, the first TSV 130 may have a shape passing through the first semiconductor substrate 110. In addition, in some embodiments, a portion of the first semiconductor substrate 110 may be removed so that the first TSV 130 further protrudes with respect to the second surface 114, and therefore extends beyond the second surface 114.

For example, in order to expose the TSV 130, a portion of the first semiconductor substrate 110 may be removed through a chemical mechanical polishing (CMP) process, an etch-back process, or a combination thereof.

Subsequently, a first rear protection layer 136 covering an exposed surface (e.g., the second surface 114 of the first semiconductor substrate 110) of the first semiconductor wafer W1 may be formed. The first rear protection layer 136 may be formed by, for example, a spin coating process or a spray process. The first rear protection layer 136 may include, for example, an insulating polymer. In order to form the first rear protection layer 136, an insulating polymer layer covering the second surface 114 of the first semiconductor substrate 110 and the first TSV 130 exposed may be formed, and then, the first TSV 130 may be exposed by removing a portion of the insulating polymer layer through an etch-back process.

A first upper connection pad 138 electrically connected to a portion of the first TSV 130 exposed by the first rear protection layer 136 may be formed. Optionally, the first upper connection pad 138 may be omitted.

Figure 5:
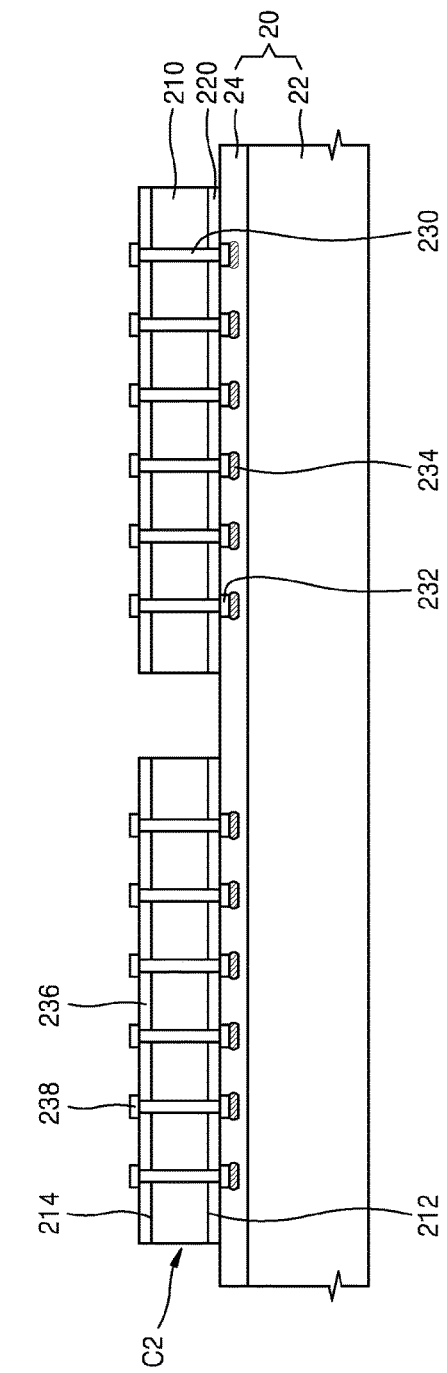

Referring to FIG. 5, a second semiconductor chip C2 may be prepared. In order to prepare the second semiconductor chip C2, a second semiconductor wafer (not shown) may be processed similarly to the first semiconductor wafer W1 illustrated in FIGS. 1 to 4, and then, the second semiconductor chip C2 may be prepared by singulating or dicing the second semiconductor wafer.

The second semiconductor chip C2 may include a second semiconductor substrate 210 and a second semiconductor device layer 220 formed on the second semiconductor substrate 210. The second semiconductor device layer 220 may form an integrated circuit, and may include a plurality of individual devices including system LSI, flash memory, dynamic random access memory (DRAM), static random access memory (SRAM), electrical erasable programmable read only memory (EEPROM), phase-change random access memory (PRAM), magnetoresistive random access memory (MRAM), or resistive random access memory (RRAM).

In exemplary embodiments, the second semiconductor wafer may be a semiconductor wafer including a different kind of individual device formed by a process different from a process of forming the first semiconductor wafer W1. Therefore, the second semiconductor chip C2 may be a different kind of semiconductor chip including an individual device different from the individual devices included in the first semiconductor chip C1. For example, the first semiconductor wafer W1 may include a first semiconductor chip C1 including system LSI, and the second semiconductor chip C2 may include DRAM. The first semiconductor chip C1 may be a logic chip, and the second semiconductor chip C2 may be a memory chip.

In other embodiments, the second semiconductor wafer may be a semiconductor wafer including a same kind of individual device formed by a process which is the same as a process of forming the first semiconductor wafer W1. The second semiconductor chip C2 may be a same kind of semiconductor chip including an individual device which is the same as the individual devices included in the first semiconductor chip C1. For example, the first semiconductor wafer W1 may include a first semiconductor chip C1 including a DRAM chip, and the second semiconductor chip C2 may include DRAM.

The second semiconductor chip C2 may be provided in plurality. The plurality of second semiconductor chips C2 may be attached on a second carrier substrate 20 in the form of the second semiconductor wafer W2 where the plurality of second semiconductor chips C2 are connected to each other, and then, the second semiconductor wafer may be diced into the plurality of second semiconductor chips C2.

The plurality of second semiconductor chips C2 may each include a second semiconductor substrate 210, a second semiconductor device layer 220, and a second through electrode 230. The second semiconductor substrate 210 may include a first surface 212 and a second surface 214 which are opposite to each other. The second through electrode 230 may pass through the second semiconductor substrate 210.

The plurality of second semiconductor chips C2 may each include a second connection pad 232, a second connection bump 234, a second rear protection layer 236, and a second upper connection pad 238. Detailed descriptions on the second connection pad 232, the second connection bump 234, the second rear protection layer 236, and the second upper connection pad 238 are similar to the first connection pad 132, the first connection bump 134, the first rear protection layer 136, and the first upper connection pad 138 described above with reference to FIG. 2.

Figure 6:
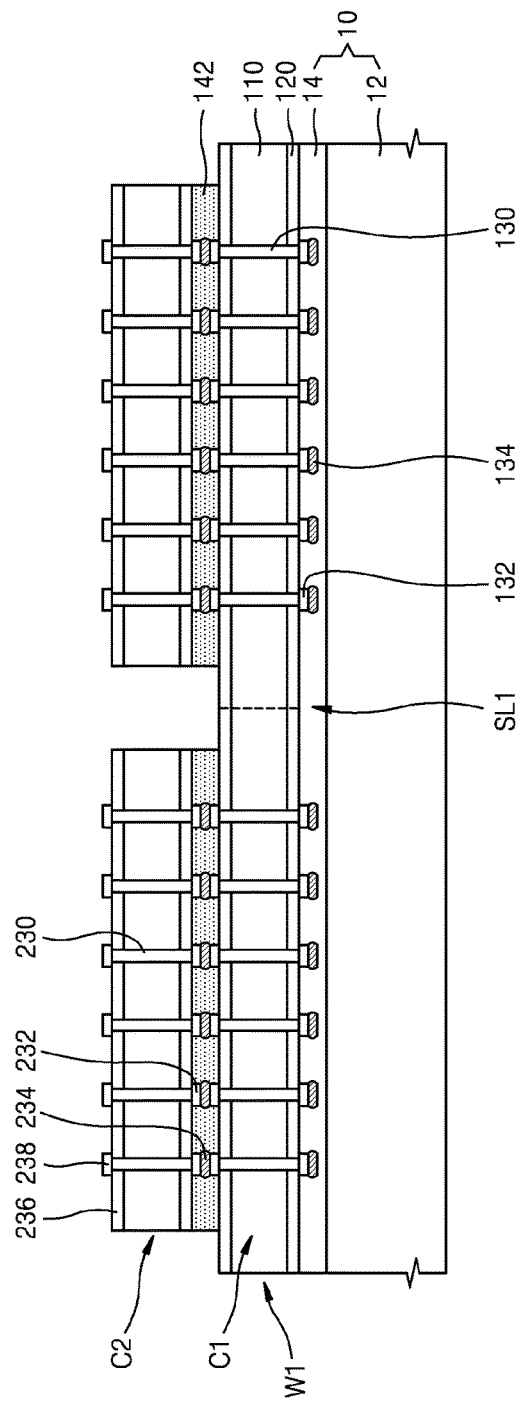

Referring to FIG. 6, the plurality of second semiconductor chips C2 may be separated from the second carrier substrate 20 illustrated in FIG. 5 and may be stacked on the first semiconductor wafer W1 illustrated in FIG. 6. The plurality of second semiconductor chips C2 may be stacked on the first semiconductor wafer W1 to respectively correspond to the plurality of first semiconductor chips C1 included in the first semiconductor wafer W1. For example, the plurality of second semiconductor chips C2 may be stacked on the plurality of first semiconductor chips C1 to respectively correspond to the first semiconductor chips C1.

In exemplary embodiments, each of the second semiconductor chips C2 may be attached on a corresponding first semiconductor chip C1 with a first insulating material layer 142 therebetween. For example, before the plurality of second semiconductor chips C2 are attached on the second carrier substrate 20 in the form of the second semiconductor wafer W2 where the plurality of second semiconductor chips C2 are connected to each other, the first insulating material layer 142 may be disposed between the second semiconductor wafer W2 and the second carrier substrate 20. Subsequently, the second semiconductor wafer W2 may be diced into the plurality of second semiconductor chips C2, and the first insulating material layer 142 may be located on the first semiconductor chip C1 in a state of being attached on each of the second semiconductor chips C2.

Each of the second semiconductor chips C2 may be stacked on a corresponding first semiconductor chip C1 in order for the first through electrode 130 to be electrically connected to the second through electrode 230. In order for the first through electrode 130 to be electrically connected to the second through electrode 230, each of the second semiconductor chips C2 may be stacked on a corresponding first semiconductor chip C1 in order for the second connection bump 234 of a corresponding second semiconductor chip C2 to contact the first upper connection pad 134. If the first upper connection pad 134 is not formed, the second connection bump 234 may contact the first through electrode 130.

After the second semiconductor chips C2 are respectively stacked on the first semiconductor chips C1, an adhesive force between the second connection bump 234 and the first upper connection pad 134 or between the second connection bump 234 and the first through electrode 130 may increase by performing a reflow process or a thermal compression process, thereby decreasing contact resistance.

As exemplarily illustrated in FIG. 6, the first insulating material layer 142 may be disposed between the first semiconductor chip C1 and the second semiconductor chip C2 to surround the first upper connection pad 138 and the second connection bump 234, and to surround a plurality of first upper connection pads 138 and second connection bumps 234. For example, the first insulating material layer 142 may surround and cover all of the first upper connection pads 138 and second connection bumps 234 disposed between and connecting the first semiconductor chip C1 to the second semiconductor chip C2. In exemplary embodiments, the first insulating material layer 142 may be an insulating polymer. For example, the first insulating material layer 142 may be formed by attaching a nonconductive film (NCF). The first insulating material layer 142 may be an under-fill member that seals a connection portion between the first semiconductor chip C1 and the second semiconductor chip C2 and fills a space between the first semiconductor chip C1 and the second semiconductor chip C2.

Here, the term "under-fill member" may not necessarily denote an element formed by a specific manufacturing method or formed of a specific material but may denote a material layer that fills a space between semiconductor chips, a space between a semiconductor chip and an interposer, or a space between the interposer and a printed circuit board (PCB). For example, it should be understood that the under-fill member denotes an insulating material layer described herein, or an under-fill layer or an under-fill material layer to be described below.

Figure 7:
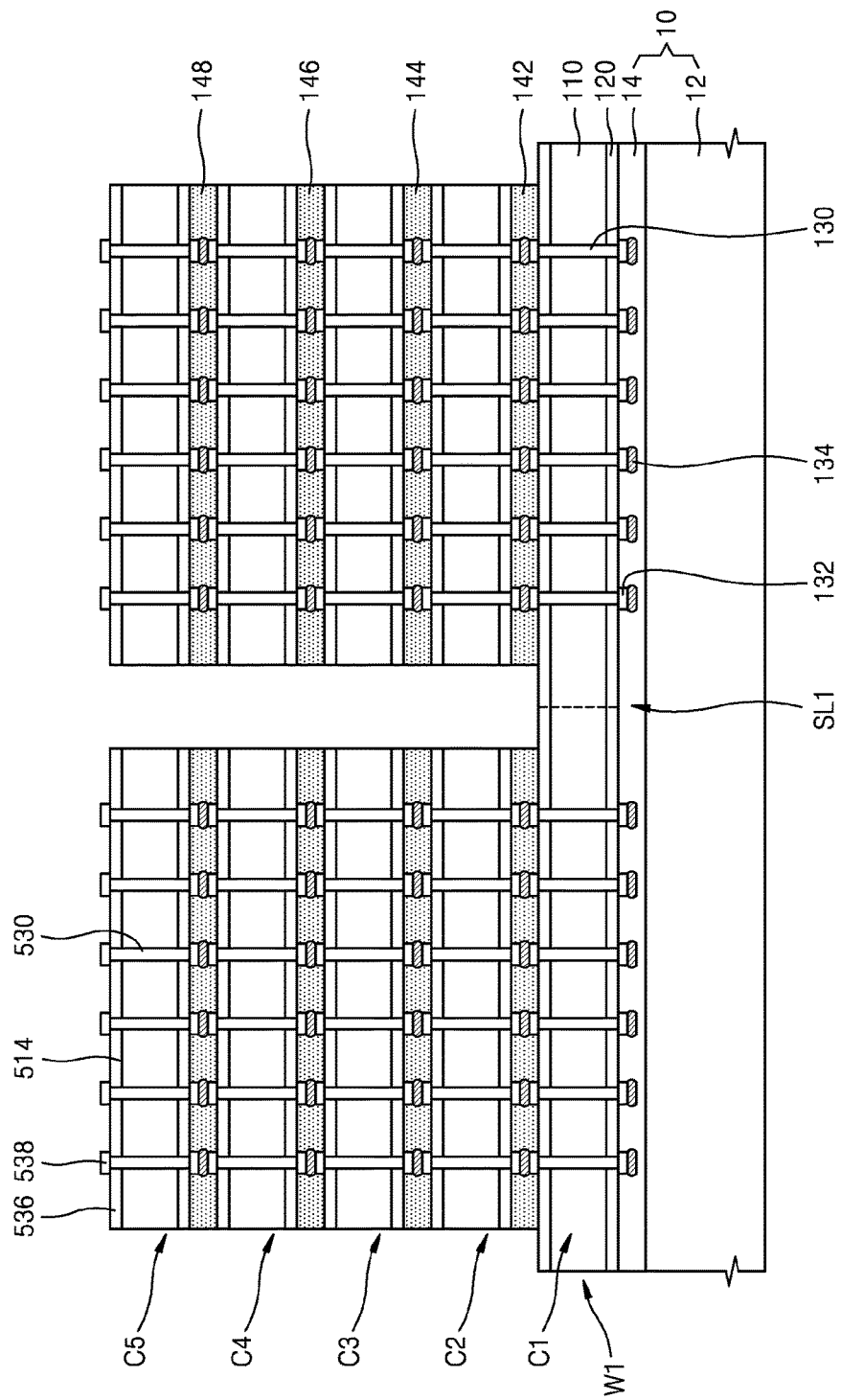

Referring to FIG. 7, by repeating the processes described above with reference to FIGS. 5 and 6, a plurality of third semiconductor chips C3 may be stacked on the first semiconductor wafer W1 with a second insulating material layer 144 therebetween on the plurality of second semiconductor chips C2 to respectively correspond to the plurality of second semiconductor chips C2. Subsequently, by performing a reflow process or a thermal compression process, each of the third semiconductor chips C3 may be electrically connected to a corresponding second semiconductor chip C2. Similarly, a plurality of fourth semiconductor chips C4 may be stacked on the first semiconductor wafer W1 with a third insulating material layer 146 therebetween on the plurality of third semiconductor chips C3 to respectively correspond to the plurality of third semiconductor chips C3. Subsequently, by performing a reflow process or a thermal compression process, each of the fourth semiconductor chips C4 may be electrically connected to a corresponding third semiconductor chip C3. Also, a plurality of fifth semiconductor chips C5 may be stacked on the first semiconductor wafer W1 with a fourth insulating material layer 148 therebetween on the plurality of fourth semiconductor chips C4 to respectively correspond to the plurality of fourth semiconductor chips C4. Subsequently, by performing a reflow process or a thermal compression process, each of the fifth semiconductor chips C5 may be electrically connected to a corresponding fourth semiconductor chip C4.

The second to fifth semiconductor chips C2 to C5 may be a same kind of semiconductor chips each including the same individual device. Alternatively, the second to fifth semiconductor chips C2 to C5 may be different kinds of semiconductor chips including different individual devices. Although in FIG. 7 a five-semiconductor chip stacked structure where the second to fifth semiconductor chips C2 to C5 are vertically stacked on the first semiconductor wafer W1 is exemplarily illustrated, the number of semiconductor chips stacked on the first semiconductor wafer W1 may be changed.

Moreover, in forming the first insulating material layer 142 between the first semiconductor chip C1 and the second semiconductor chip C2, a first under-fill layer, for example, may be formed of an epoxy resin by a capillary under-fill process. The first under-fill layer may be mixed with a filler, and the filler may include, for example, silica. Similarly, instead of the second to fourth insulating material layers 144, 146 and 148, second to fourth under-fill layers may be formed.

Figure 8:
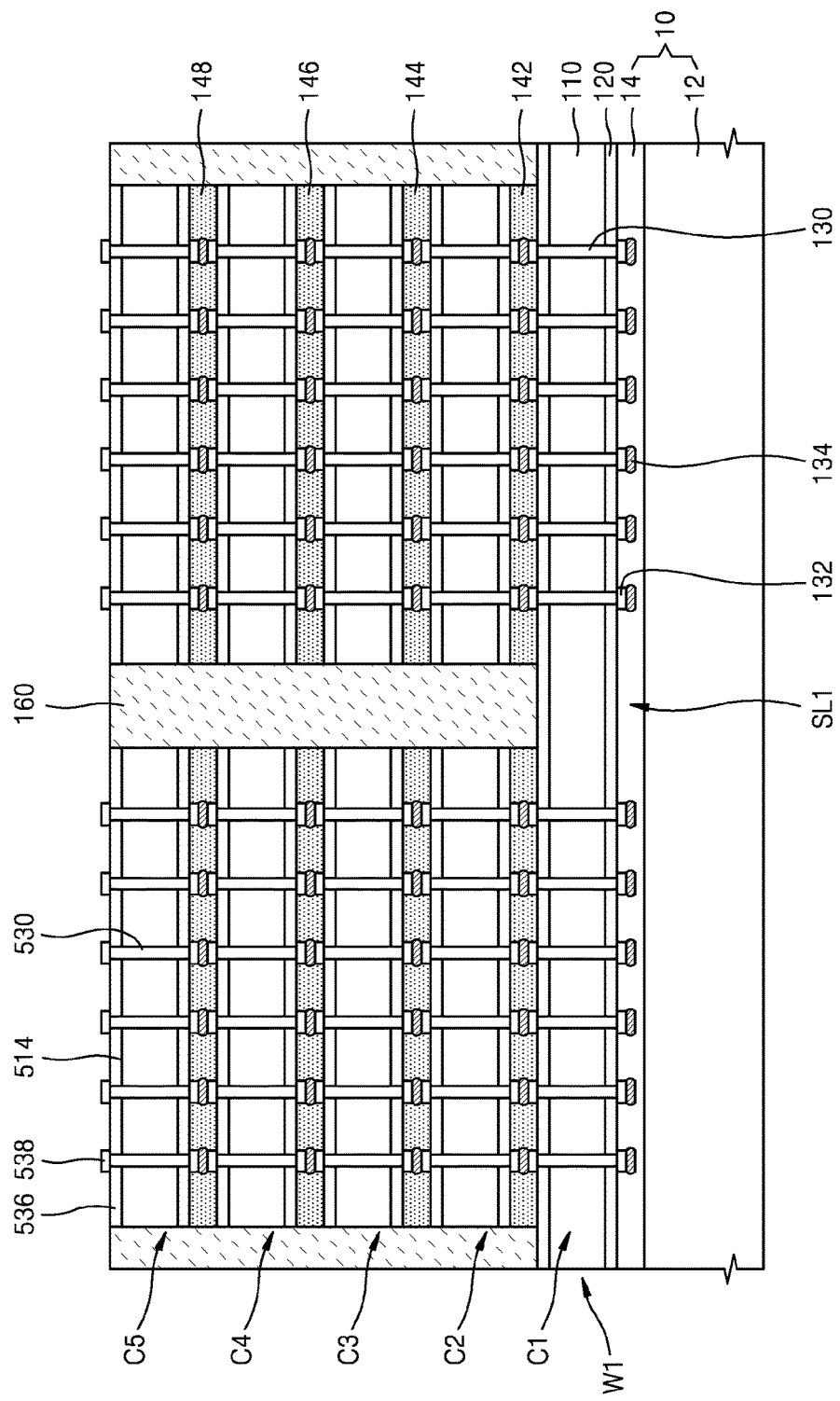

Referring to FIG. 8, a first mold layer 160 covering the second to fifth semiconductor chips C2 to C5 may be formed on the first semiconductor wafer W1. The first mold layer 160, also described as an encapsulation layer, may surround sides (e.g., side surfaces) of the second to fifth semiconductor chips C2 to C5. The first mold layer 160 may contact a portion of a top of the first semiconductor chip C1. Since the first to fourth insulating material layers 142, 144, 146 and 148 are disposed between the first to fifth semiconductor chips C1 to C5, the first mold layer 160 may surround sides (e.g., side surfaces) of the first to fourth insulating material layers 142, 144, 146 and 148. In exemplary embodiments, the first mold layer 160 may include an epoxy mold compound (EMC).

As exemplarily illustrated in FIG. 8, in one embodiment, the first mold layer 160 does not cover a top 512 of the fifth semiconductor chip C5. Therefore, a rear protection layer 536 and a fifth upper connection pad 538 included in the fifth semiconductor chip C5 may be exposed to the outside of the first mold layer 160.

Figure 9:
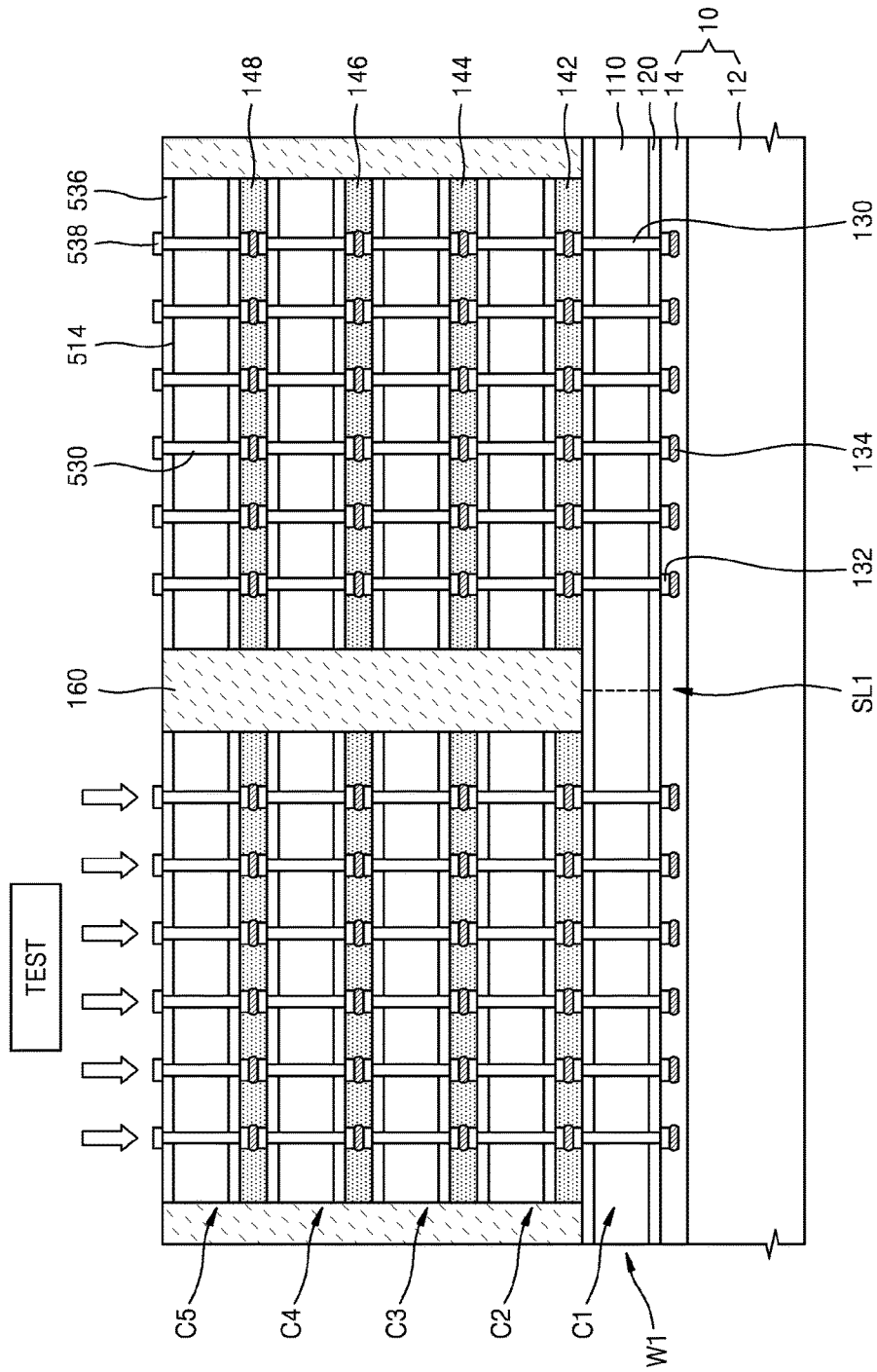

Referring to FIG. 9, an electrical characteristic test for evaluating a normal operation or a defect of each of the first to fifth semiconductor chips C1 to C5 may be performed by using the fifth upper connection pad 538 of the fifth semiconductor chip C5 exposed by the first mold layer 160. The electrical characteristic test can be one of many known test procedures for testing chip stacks.

As exemplarily illustrated in FIG. 9, the fifth semiconductor chip C5 may include a fifth TSV 530, and the fifth upper connection pad 538 may be provided on a second surface 514 of the fifth semiconductor chip C5. Therefore, the electrical characteristic test may be easily performed in a state where the first to fifth semiconductor chips C1 to C5 are stacked on the first carrier substrate 10, namely, a state where the first to fifth semiconductor chips C1 to C5 are not separated from the first carrier substrate 10.

Generally, since a semiconductor chip disposed on an uppermost portion of a chip stack (e.g., a top chip in the stack) does not include a TSV (and/or an upper connection pad), in order to perform the electrical characteristic test, it is required that a stacked structure of a semiconductor chip is separated from a carrier substrate, and the stacked structure of the semiconductor chip is vertically reversed so that a stacked structure of a semiconductor chip disposed in a lowermost portion (e.g., a bottom chip in the stack) faces upward. However, according to disclosed embodiments, since the fifth semiconductor chip C5 includes the fifth TSV 530 and the fifth upper connection pad 538, in order to perform the electrical characteristic test, it is not required that a stacked structure of the first to fifth semiconductor chips C1 to C5 is separated from the first carrier substrate 10, or is vertically reversed. Accordingly, the electrical characteristic test may be easily performed on the first to fifth semiconductor chips C1 to C5.

Figure 10:
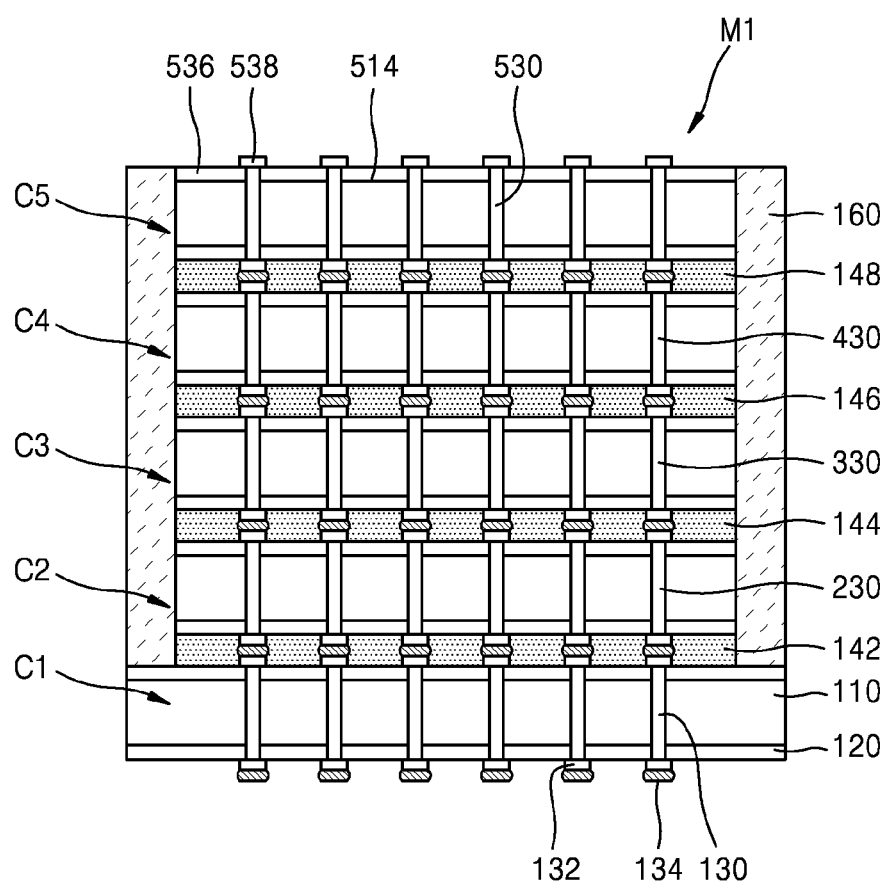

Referring to FIG. 10, by dicing the first semiconductor wafer W1 (see FIG. 9) along the first scribe lane SL1 (see FIG. 2), the first semiconductor wafer W1 may be diced into a plurality of sub-package units M1 including the first to fifth semiconductor chips C1 to C5 corresponding to each other. Each sub-package unit M1 (or M2) may also be described herein as a partial package chip stack.

The sub-package unit M1 may have a structure in which the second semiconductor chip C2 including the second TSV 230, the third semiconductor chip C3 including the third TSV 330, the fourth semiconductor chip C4 including the fourth TSV 430, and the fifth semiconductor chip C5 including the fifth TSV 530 are sequentially stacked on the first semiconductor chip C1 including the first TSV 130. The first through fifth semiconductor chips C1 to C5 may be a chip stack partially covered with a mold layer. For example, the chip stack may include a mold layer covering an edge portion of a top surface of a first semiconductor chip C1, and covering side surfaces of the remaining semiconductor chips C2-C5.

In exemplary embodiments, the first to fifth semiconductor chips C1 to C5 may be a same kind of semiconductor chips. For example, the first to fifth semiconductor chips C1 to C5 may each be a memory chip. In other embodiments, the first semiconductor chip C1 may be different from the second to fifth semiconductor chips C2 to C5. For example, the first semiconductor chip C1 may be a logic chip, and the second to fifth semiconductor chips C2 to C5 may each be a memory chip. In other embodiments, the first semiconductor chip C1 may be a buffer chip, and the second to fifth semiconductor chips C2 to C5 may each be a memory chip. However, the technical spirit of the inventive concept is not limited thereto. According to various embodiments described herein, each semiconductor chip C1 to C5 in the sub-package unit M1 (and M2) includes an integrated circuit. For example, the integrated circuit can be formed on a semiconductor die formed from a wafer.

In exemplary embodiments, the second to fifth semiconductor chips C2 to C5 may substantially have the same horizontal cross-sectional area, and a horizontal cross-sectional area of the first semiconductor chip C1 may be larger than those of the second to fifth semiconductor chips C2 to C5.

The first insulating material layer 142 may be disposed between the first semiconductor chip C1 and the second semiconductor chip C2, the second insulating material layer 144 may be disposed between the second semiconductor chip C2 and the third semiconductor chip C3. Also, the third insulating material layer 146 may be disposed between the third semiconductor chip C3 and the fourth semiconductor chip C4, and the fourth insulating material layer 148 may be disposed between the fourth semiconductor chip C4 and the fifth semiconductor chip C5.

The first mold layer 160 may be formed on a portion on the first semiconductor chip C1 to surround the sides of the second to fifth semiconductor chips C2 to C5. The first semiconductor chip C1 may have a horizontal cross-sectional area that is larger than those of the second to fifth semiconductor chips C2 to C5, and thus, the side of the first semiconductor chip C1 may not be surrounded by the first mold layer 160. A side of the first mold layer 160 may be aligned with the side of the first semiconductor chip C1. For example, side surfaces of the first mold layer 160 and the first semiconductor chip C1 may be coplanar. The first mold layer 160 may contact the first to fourth insulating material layers 142, 144, 146 and 148.

The second to fourth semiconductor chips C2 to C4 may be electrically connected to the first semiconductor chip C1 and the fifth semiconductor chip C5 through the second to fourth TSVs 230, 330, and 430. Since the sides of the second to fourth semiconductor chips C2 to C4 are surrounded by the first mold layer 160, the second to fourth semiconductor chips C2 to C4 may not be exposed to the outside of the sub-package unit M1, and the first connection bump 134 of the first semiconductor chip C1 and the fifth upper connection pad 538 of the fifth semiconductor chip C5 may be exposed to the outside of the sub-package unit M1. In other embodiments, the fifth upper connection pad 538 may not be provided, and in this case, the fifth TSV 530 may be exposed to the outside of the sub-package unit M1.

The first semiconductor chip C1 may not include a redistribution wiring layer. Therefore, a pitch (or an interval between adjacent first TSVs 130) of the first TSV 130 may be substantially the same as a pitch (or an interval between adjacent first connection bumps 134) of the first connection bump 134. Also, the first TSV 130 may be aligned with the first connection bump 134 along a direction vertical to a top of the first semiconductor chip C1 and may be aligned with the second to fifth TSVs 230, 330, 430, and 530 along a direction vertical to the top of the first semiconductor chip C1. Here, the first TSV 130 being aligned with the first connection bump 134 along a vertical direction may denote that the first TSV 130 overlaps the first connection bump 134 when viewed from an uppermost surface of the sub-package unit M1 (e.g., when viewed in a plan view). Since the first TSV 130 is aligned with the second to fifth TSVs 230, 330, 430, and 530 along a vertical direction, the first connection bump 134 and the fifth upper connection pad 538 may be aligned with each other along a vertical direction. Accordingly, the sub-package unit M1 may be vertically stacked on another sub-package unit M1 (e.g., without the use of a redistribution layer, package substrate, or interposer substrate therebetween).

Hereinabove, an example where the sub-package unit M1 includes the vertically stacked first to fifth semiconductor chips C1 to C5 has been exemplarily described, but the technical spirit of the inventive concept is not limited thereto. For example, the number of stacked semiconductor chips in the sub-package unit M1 may be changed. For example, the sub-package unit M1 may include two to four semiconductor chips, or may include six or more semiconductor chips.

Figure 11:
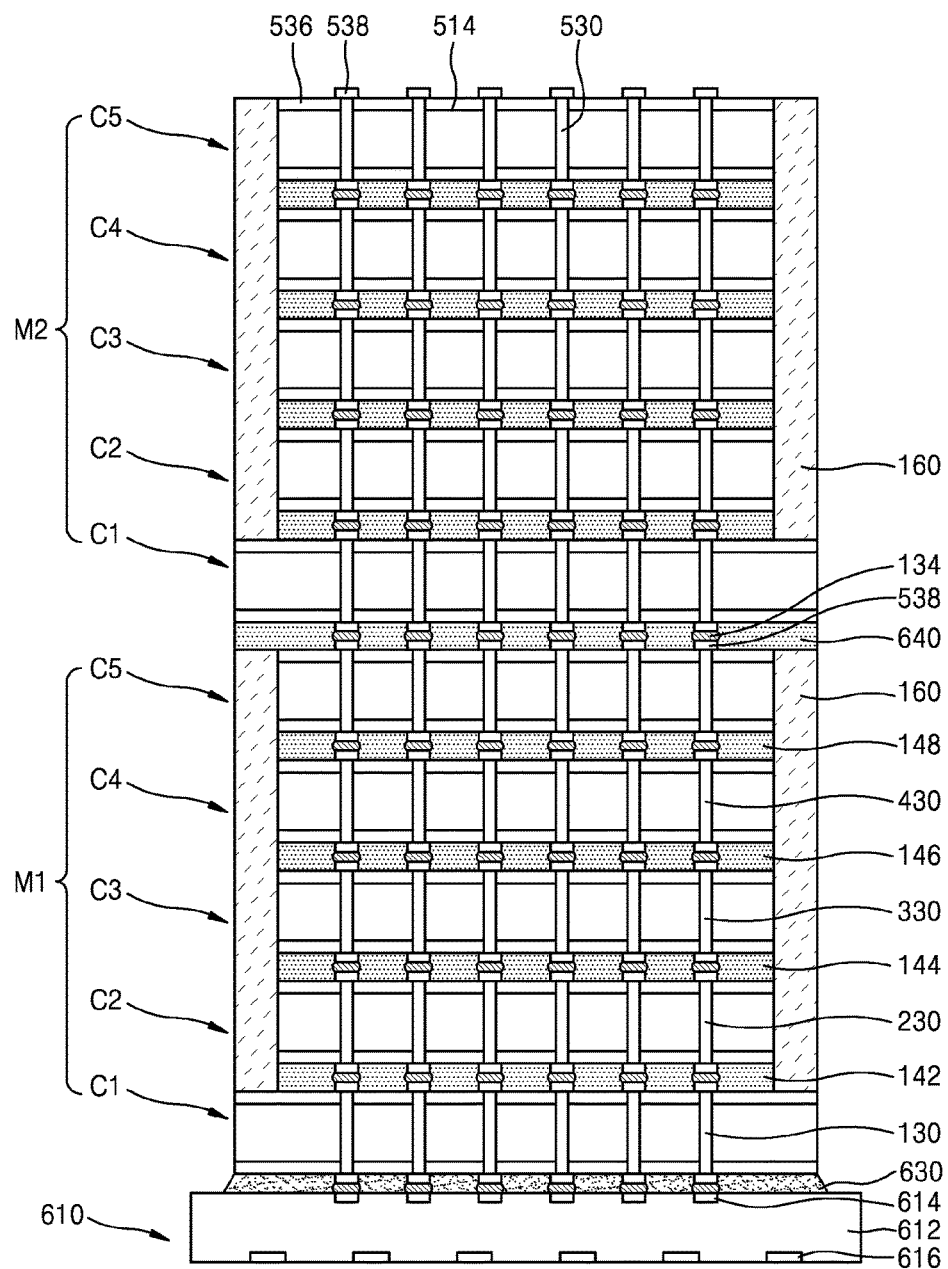

Referring to FIG. 11, an interposer 610 may be optionally prepared and provided.

The interposer 610 may include a substrate base 612, a top pad 614 provided on a top of the substrate base 612, and a bottom pad 616 provided on a bottom of the substrate base 612. In exemplary embodiments, the substrate base 612 may include a semiconductor material, and for example, may be formed from a silicon wafer. An inner wiring (not shown) may be formed on the top, the bottom, or the inside of the substrate base 612. Also, a TSV (not shown) and a redistribution wiring layer (not shown) that electrically connect the top pad 614 to the bottom pad 616 may be formed in the substrate base 612.

For example, the interposer 610 may be attached on a carrier substrate (not shown), and the sub-package unit M1 may be disposed on the interposer 610. In this case, the sub-package unit M1 may be disposed such that the first semiconductor chip C1 of the sub-package unit M1 faces the top pad 614 of the interposer 610. Subsequently, by performing a reflow process, or a thermal compression process, the first connection bump 134 of the first semiconductor chip C1 may be attached on the top pad 614.

In one embodiment, subsequently, an under-fill layer 630 may be formed between the sub-package unit M1 and the interposer 610. The under-fill layer 630, for example, may be formed of an epoxy resin by a capillary under-fill process. The under-fill layer 630 may be mixed with a filler, and the filler may include, for example, silica. In other embodiments, instead of forming the under-fill layer 630 between the sub-package unit M1 and the interposer 610, an insulating material layer (not shown) may be formed by using an insulating polymer or a nonconductive film.

In one embodiment, subsequently, a sub-package unit M2 may be disposed on the sub-package unit M1. The sub-package unit M2 may have the same technical feature as that of the sub-package unit M1 described above with reference to FIG. 10.

As exemplarily illustrated in FIG. 11, a first semiconductor chip C1 of the sub-package unit M2 may be disposed on the fifth semiconductor chip C5 of the sub-package unit M1, and a first connection bump 134 of the first semiconductor chip C1 of the sub-package unit M2 may be disposed on the fifth upper connection pad 538 of the fifth semiconductor chip C5 of the sub-package unit M1.

A fifth insulating material layer 640 may be disposed between the sub-package unit M1 and the sub-package unit M2. The fifth insulating material layer 640 may include an insulating polymer or a nonconductive film. In one embodiment, the fifth insulating material layer 640 may have a horizontal cross-sectional area that is larger than those of the first to fourth insulating material layers 142, 144, 146 and 148. Therefore, an edge of the fifth insulating material layer 640 may be disposed between the first mold layer 160 of the sub-package unit M1 and the first mold layer 160 of the sub-package unit M2, and may have a side surface coplanar with side surfaces of the first mold layer 160 of the sub-package unit M1 and the first mold layer 160 of the sub-package unit M2.

Subsequently, by performing a reflow process or a thermal compression process, the first connection bump 134 of the first semiconductor chip C1 of the sub-package unit M2 may be attached on the fifth upper connection pad 538 of the fifth semiconductor chip C5 of the sub-package unit M1, and the fifth insulating material layer 640 may be disposed between the first semiconductor chip C1 of the sub-package unit M2 and the fifth upper connection pad 538 of the fifth semiconductor chip C5 of the sub-package unit M1 to surround the first connection bump 134 and the fifth upper connection pad 538. In this manner, FIG. 11 illustrates a method of attaching a first sub-package unit, or partial package chip stack (e.g. M1) to a second sub-package unit, or partial package chip stack (e.g., M2) after each of the first sub-package unit and second sub-package unit have been formed, by connecting top connection terminals of the first sub-package unit (e.g., pads 538 or in other embodiments a protruding TSV) to bottom connection terminals of the second sub-package unit (e.g., pads 132 or in other embodiments a protruding TSV) by solder bumps (e.g., bumps 134) directly connected to respective ones of each of the top terminals and bottom terminals. In this manner, one sub-package unit (e.g., M2) can be directly connected to another sub-package unit (e.g., M1) using the solder bumps.

In FIG. 11, an example where the sub-package units M1 and M2 are stacked is exemplarily illustrated. Alternatively, other sub-package units M1 and M2 may be further stacked on the sub-package unit M2. For example, the number of sub-package units M1 and M2 which may be stacked may be changed based on a desired capacity of a memory chip.

Each of the sub-package unit M1 and M2 stacked on the interposer 610 may be a sub-package unit (e.g., a known good package (KGP) unit) of which a normal operation has been verified in the electrical characteristic test described above with reference to FIG. 9. For example, semiconductor chips which are defective in electrical connection may be screened in a process of forming the sub-package units M1 and M2, prior to forming a completely connected stack of chips for a package, and only the sub-package units M1 and M2 which normally operate may be stacked on the interposer 610.

Figure 12:
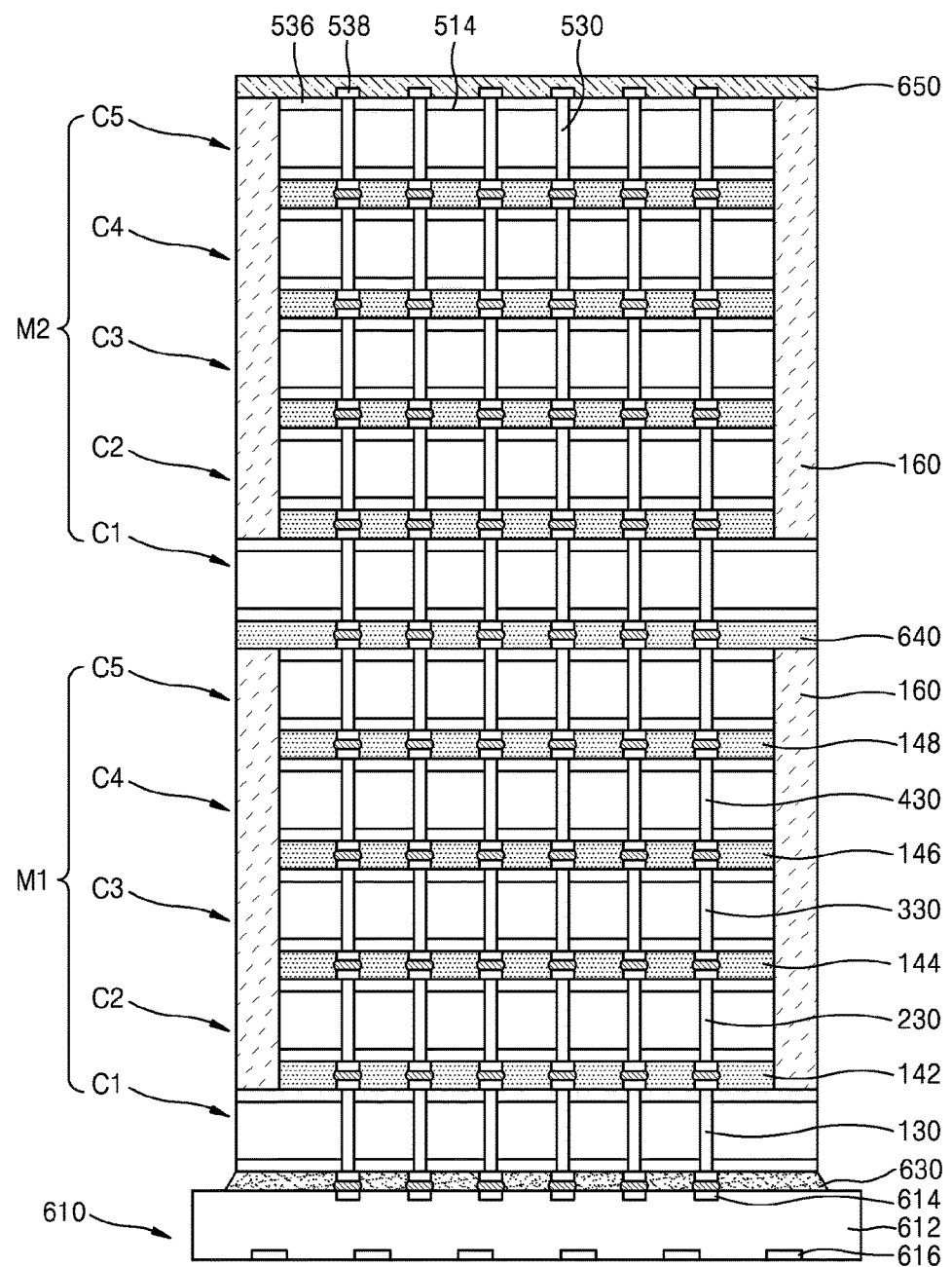

Referring to FIG. 12, an insulating member 650 may be attached on the sub-package unit M2. The insulating member 650 may cover the fifth upper connection pad 538 (a fifth TSV 530 when the fifth upper connection pad 538 is not provided) exposed to the outside of the sub-package unit M2. The insulating member 650 may be, for example, a layer of insulative material.

Figure 13:
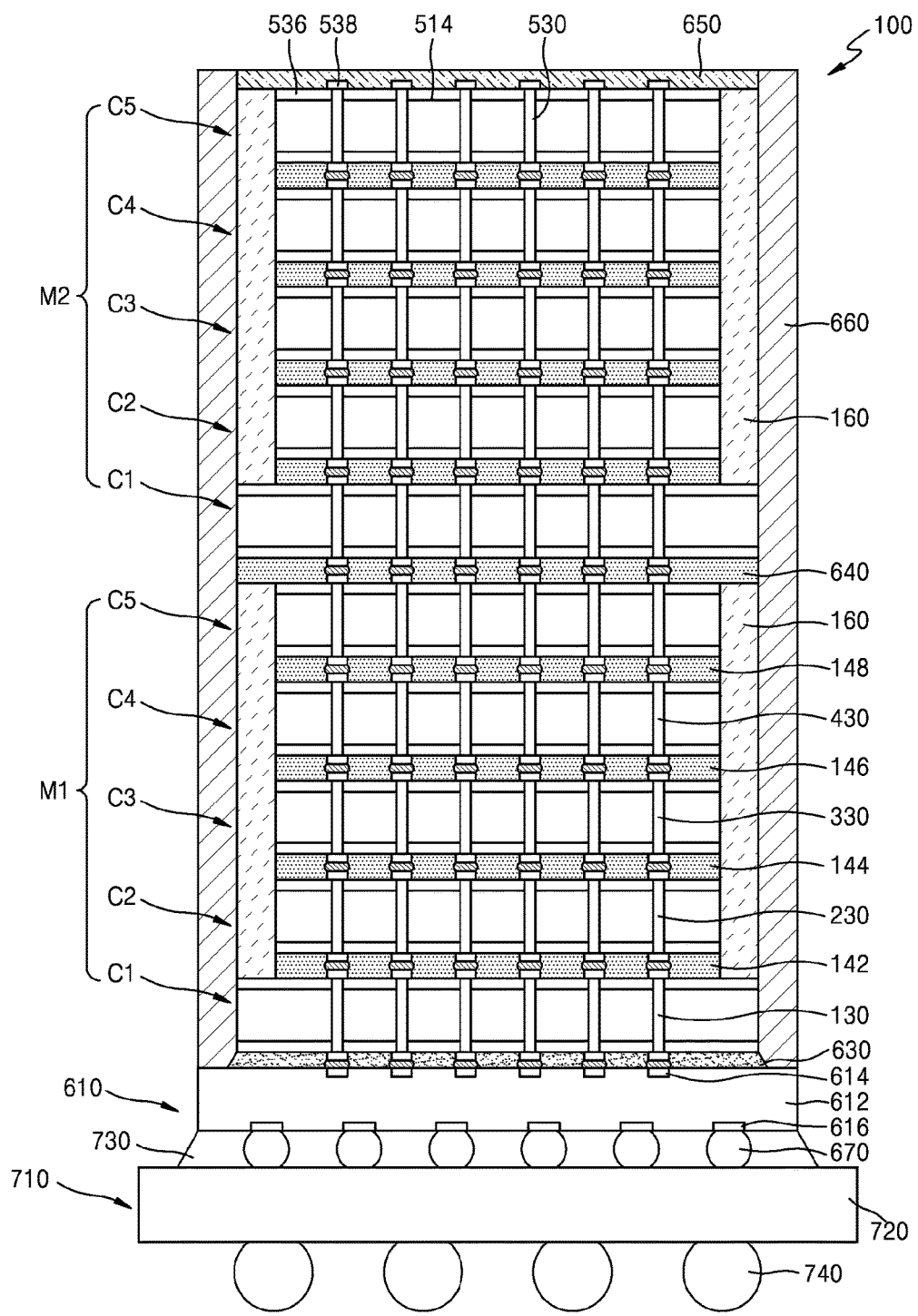

Referring to FIG. 13, a second mold layer 660 surrounding sides of the sub-package units M1 and M2 may be formed on the interposer 610. The second mold layer 660 may surround a side of the first mold layer 160 and a side of the first semiconductor chip C1 and may be disposed in a portion of a top of the interposer 610. The fifth insulating material layer 640 disposed between the sub-package units M1 and M2 may also contact the second mold layer 660. In one embodiment, the second mold layer 660 has outer side surfaces that are coplanar with respective side surfaces of the interposer 610. However, the embodiments are not necessarily limited to that configuration.

As exemplarily illustrated in FIG. 13, an interface between the second mold layer 660 and the first mold layer 160 may be aligned with an interface between the second mold layer 660 and the fifth insulating material layer 640. For example, the second mold layer 660 may include a side surface which is substantially flat and continuous near a boundary between the first mold layer 160 and the fifth insulating material layer 640. An inner side surface of the second mold layer 660 may be planar.

An interposer connection terminal 670 may be attached on a bottom of the interposer 610. The interposer connection terminal 670 may be attached on, for example, the bottom pad 616. The interposer connection terminal 670 may be, for example, a solder ball or a bump.

In exemplary embodiments, the interposer connection terminal 670 may include an under bump metal (UBM) (not shown) disposed on the bottom pad 616 and a solder ball (not shown) disposed on the UBM, at the bottom of the interposer 610. The interposer connection terminal 670 may further include an external connection pillar (not shown) disposed between the UBM and the solder ball, and the external connection pillar may include, for example, copper.

Subsequently, a PCB 710 may be provided.

The PCB 710 may include a substrate base 720, a top pad (not shown) provided on a top of the substrate base 720, and a bottom pad (not shown) provided on a bottom of the substrate base 720. The top pad and the bottom pad may be exposed by a solder resist layer (not shown) that covers the top and bottom of the substrate base 720. The substrate base 720 may be formed of at least one of phenol resin, epoxy resin, and polyimide. For example, the substrate base 720 may include at least one material selected from among FR4, tetrafunctional epoxy, polyphenylene ether, epoxy/polyphenylene oxide, bismaleimide triazine (BT), Thermount®, cyanate ester, polyimide, and liquid crystal polymer. The top pad and the bottom pad may each be formed of Cu, Ni, stainless steel, beryllium copper, and/or the like. An internal wiring (not shown) electrically connected to the top pad and the bottom pad may be provided in the substrate base 720. The top pad and the bottom pad may be portions of circuit wirings, which are formed by patterning Cu foils coated on the top and bottom of the substrate base 720, exposed by the solder resist layer.

The interposer 610 may be disposed on the PCB 710 such that the interposer connection terminal 670 is located on the top pad of the PCB 710, and an under-fill layer 730 may be formed between the interposer 610 and the PCB 710. An external connection terminal 740 may be attached on the bottom pad of the PCB 710. For example, the external connection terminal 740 may be a solder ball or a bump.

Though various steps relating to FIGS. 11 to 13 are described above in a particular order and in one embodiment occur in that order, the order in which the different components are combined need not follow that order. Regardless of the order, the different elements of a completed package discussed hereinabove and hereinbelow may be provided in the form of a semiconductor device, such as a semiconductor package, which may be, for example, a memory device, a logic device, or a combined memory and logic device.

In one embodiment, as a result of the above steps, outer side surfaces of a first sub-package unit M1 may be coplanar with outer side surfaces of a second sub-package unit M2 stacked thereon. However, the outer side surfaces of the complete package unit M1+M2 may not vertically align with the outer side surfaces of the interposer 610. The interposer 610 may be a package substrate (e.g., on which semiconductor chips are stacked). The interposer 610 may be a redistribution substrate. The PCB 710 may also be a package substrate, and may be described as a redistribution substrate. For example, the interposer 610 and/or PCB 710 may have a primary function and primary elements for transferring signals between outside of the package and the various chips C1-C5 in the complete package unit M1+M2. For example, in some embodiments, neither the interposer 610 nor the PCB 710 include integrated circuitry that performs logic or storage operations. On the other hand, each of the semiconductor chips C1 to C5 may include an integrated circuit and may have a primary purpose of performing logic operations or storing data.

Also, in the above description, a structure where the interposer 610 is mounted on the PCB 710 and the sub-package units M1 and M2 are mounted on the interposer 610 has been exemplarily described, but the technical spirit of the inventive concept is not limited thereto. In other embodiments, an different number of sub-package units M1 and M2 may be stacked on a package substrate. Here, the term "package substrate" may denote an arbitrary substrate on which the sub-package units M1 and M2 according to the inventive concept are capable of being stacked, and thus, it should be understood that the package substrate includes various substrates such as the interposer 610, the PCB 710, a combination thereof, a ceramic substrate, a semiconductor substrate, etc. Unlike the illustrated in FIG. 13, the sub-package units M1 and M2 may be mounted on the interposer 610, and the PCB 710 may be omitted. Alternatively, the sub-package units M1 and M2 may be directly mounted on the PCB 710, and the interposer 610 may be omitted.

A semiconductor package 100 may be completely formed by the above-described process.

According to a method of manufacturing the semiconductor package 100, the sub-package units M1 and M2 including the first to fifth semiconductor chips C1 to C5 may be first manufactured, and may be tested to ensure they are not defective. Then, by stacking a plurality of sub-package units M1 and M2 depending on a desired capacity of a semiconductor package, the semiconductor package 100 may be completely formed.

Generally, in a case of vertically stacking a plurality of semiconductor chips each including a TSV, the semiconductor chips are sequentially stacked on a package substrate one by one. However, as the number of stacked semiconductor chips increases and/or a size and a pitch of a TSV of a semiconductor chip is reduced, a junction defect (or an interconnection defect) easily occurs in a process of stacking semiconductor chips, and for this reason, it is difficult to provide a high-reliability electrical connection between semiconductor chips. For example, in a case of stacking semiconductor chips on a package substrate one by one, it is often required that a high temperature reflow process or a thermal compression process for an electrical connection between a TSV and a connection bump is performed a plurality of times equal to the number of stacked semiconductor chips. Therefore, thermal/physical damage is applied to a connection portion between the connection bump and the TSV due to a repetitive high temperature process. In addition, in a case of stacking semiconductor chips on a package substrate one by one, after a package where a desired number of semiconductor chips are all stacked is manufactured, a defect of the package is tested. For example, when the package is determined as a package where an electrical connection is defective (for example, even though there may be only one defective semiconductor chip), the entire package may be discarded, such that all of the semiconductor chips included in the package cannot be used. For this reason, the loss of semiconductor chips increases in the semiconductor package process (or the yield rate of semiconductor chips is reduced).

However, according to the above-described method of manufacturing the semiconductor package 100, sub-package units M1 and M2 where a certain number of semiconductor chips C1 to C5 are stacked may be first manufactured, and then, the plurality of sub-package units M1 and M2 may be stacked on a package substrate, thereby obtaining the semiconductor package 100 where the semiconductor chips C1 to C5 are connected to each other through the TSVs 130, 230, 330, 430, and 530. Therefore, the semiconductor chips C1 to C5 included in the sub-package units M1 and M2 are exposed to a high temperature process performed less times, thereby preventing thermal/physical damage which is applied to the connection bump or to a connection portion between the connection bump and the TSV due to the high temperature process. Accordingly, the semiconductor package 100 has high reliability.

Moreover, a defect of each of the sub-package units M1 and M2 may be tested before the sub-package units M1 and M2 are stacked on a package substrate. Therefore, since semiconductor chips which are defective in electrical connection are previously screened in a process of manufacturing the sub-package units M1 and M2, a defect rate of the semiconductor package 100 is reduced. The two sub-package units M1 and M2 may share the same package substrate, for example, such that a top sub-package unit or partial package chip stack M2 is stacked on a bottom sub-package unit or partial package chip stack M1 without any package substrate therebetween. As such, the two sub-package units M1 and M2 may be combined in one or more of the manners described above to form a single package (e.g., semiconductor package 100 may be considered a single package having a single package substrate rather than a package-on-package device including a plurality of package substrates).

FIGS. 14 to 18 are cross-sectional views illustrating a method of manufacturing a semiconductor package 100A according to exemplary embodiments. In FIGS. 14 to 18, like reference numerals illustrated in FIGS. 1 to 13 refer to like elements.

First, by performing the process described above with reference to FIGS. 1 to 4, a first semiconductor wafer W1 (see FIG. 4) connected to a first semiconductor chip C1A may be prepared.

Figure 14:
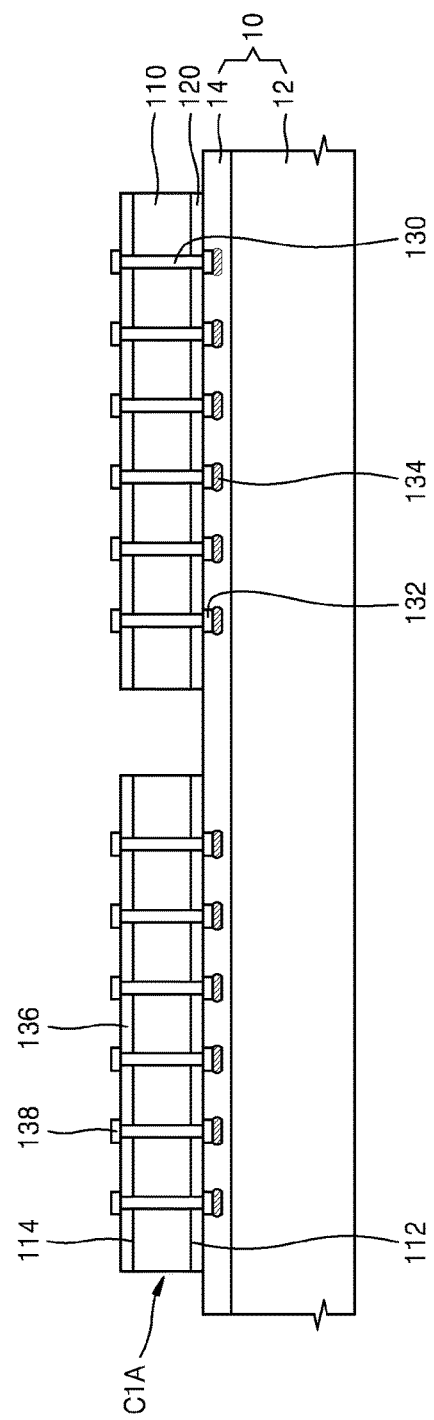
FIGS. 14 to 18 are cross-sectional views illustrating a method of manufacturing a semiconductor package according to exemplary embodiments.

Referring to FIG. 14, the first semiconductor chip C1A may be prepared by dicing the first semiconductor wafer W1. For example, the first semiconductor wafer W1 may be diced into the first semiconductor chip C1A (e.g., a plurality of first semiconductor chips C1A) in a state of being attached on a first carrier substrate 10.

Figure 15:
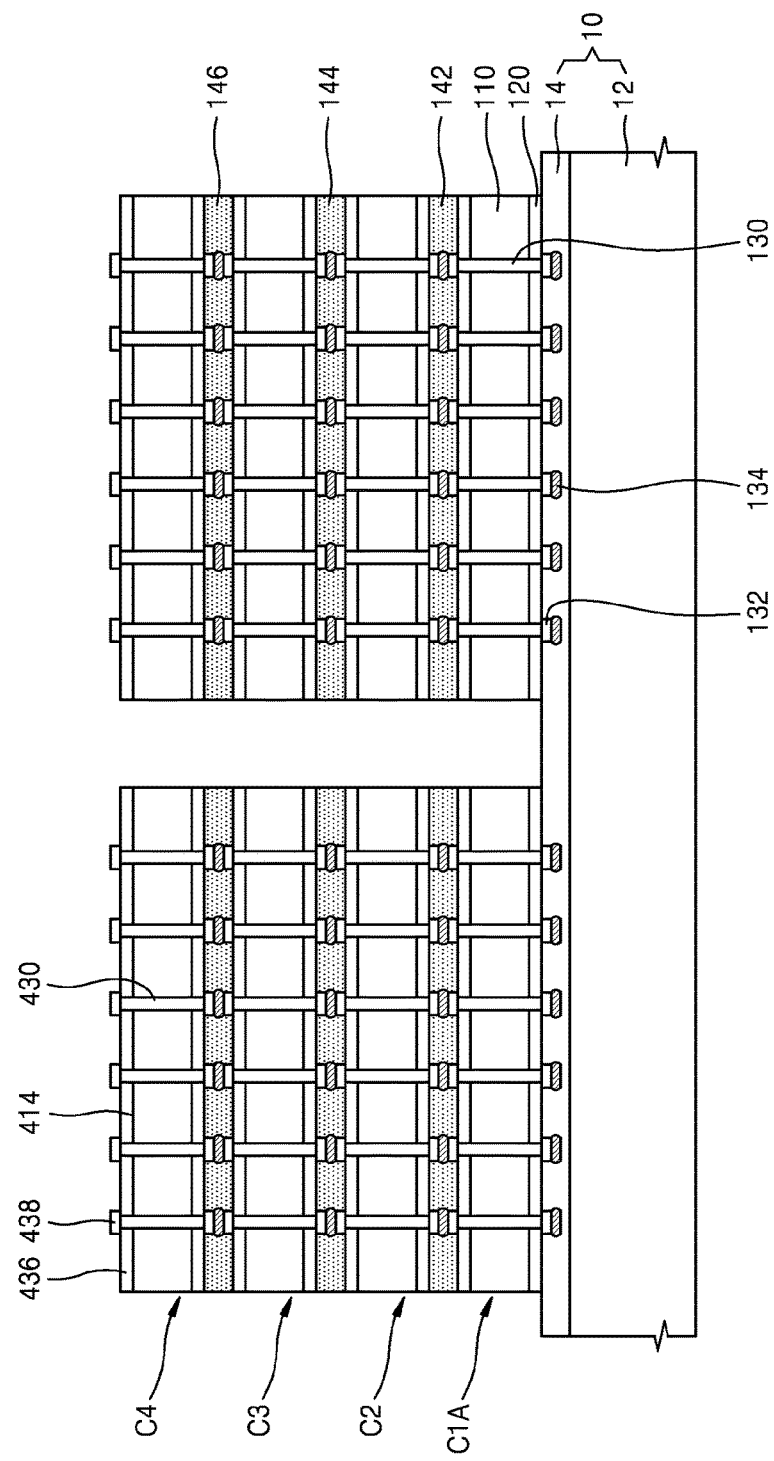

Referring to FIG. 15, in a state where the first semiconductor chip C1A separated from the first semiconductor wafer W1 is attached on the first carrier substrate 10, a second semiconductor chip C2 may be disposed on the first semiconductor chip C1A. A detailed description on the second semiconductor chip C2 is similar to the description made with reference to FIG. 5.

The first semiconductor chip C1A and the second semiconductor chip C2 may be a same kind of semiconductor chips including a same kind of individual devices. For example, the first semiconductor chip C1A and the second semiconductor chip C2 may each be a memory chip. Also, the first semiconductor chip C1A and the second semiconductor chip C2 may substantially have the same horizontal cross-sectional area. However, the technical spirit of the inventive concept is not limited thereto, and the second semiconductor chip C2 may be a different kind of semiconductor chip including an individual device different from an individual device of the first semiconductor chip C1A.

Through a process similar to the process described above with reference to FIGS. 5 to 7, a third semiconductor chip C3 may be stacked on the second semiconductor chip C2, and a fourth semiconductor chip C4 may be stacked on the third semiconductor chip C3.

Figure 16:
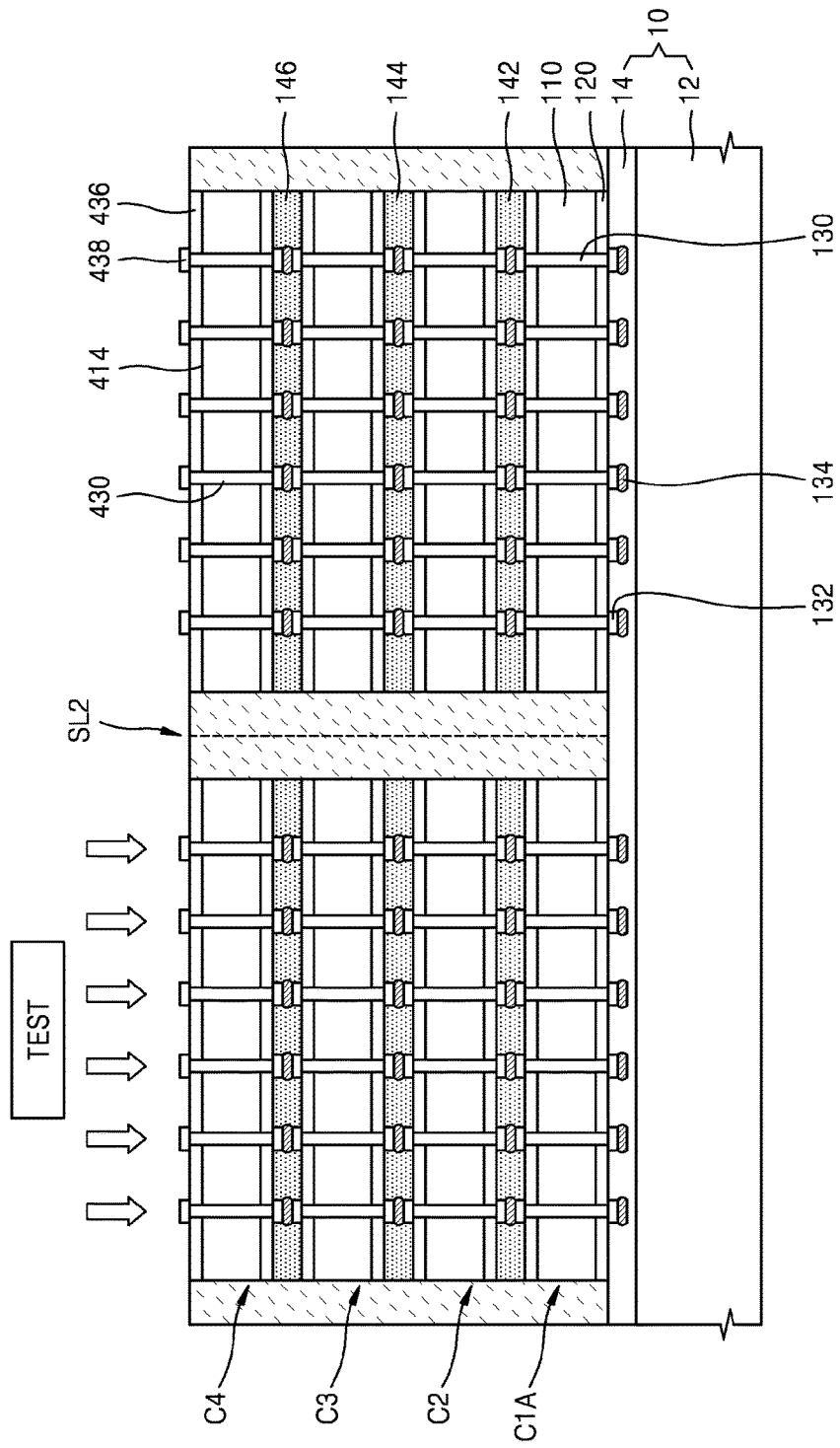

Referring to FIG. 16, a first mold layer 160 covering sides of the first to fourth semiconductor chips C1A and C2 to C4 may be formed on a carrier substrate 10. The first mold layer 160 may surround sides of first to third insulating material layers 142, 144 and 146 disposed between the first to fourth semiconductor chips C1A and C2 to C4. Also, the first mold layer 160 may not cover a second surface (or a top of the fourth semiconductor chip C4) of the fourth semiconductor chip C4.

Subsequently, an electrical characteristic test for evaluating a defect of each of the first to fourth semiconductor chips C1A and C2 to C4 may be performed by a fourth upper connection pad 438 of the fourth semiconductor chip C4 which is not covered by the first mold layer 160.

Figure 17:
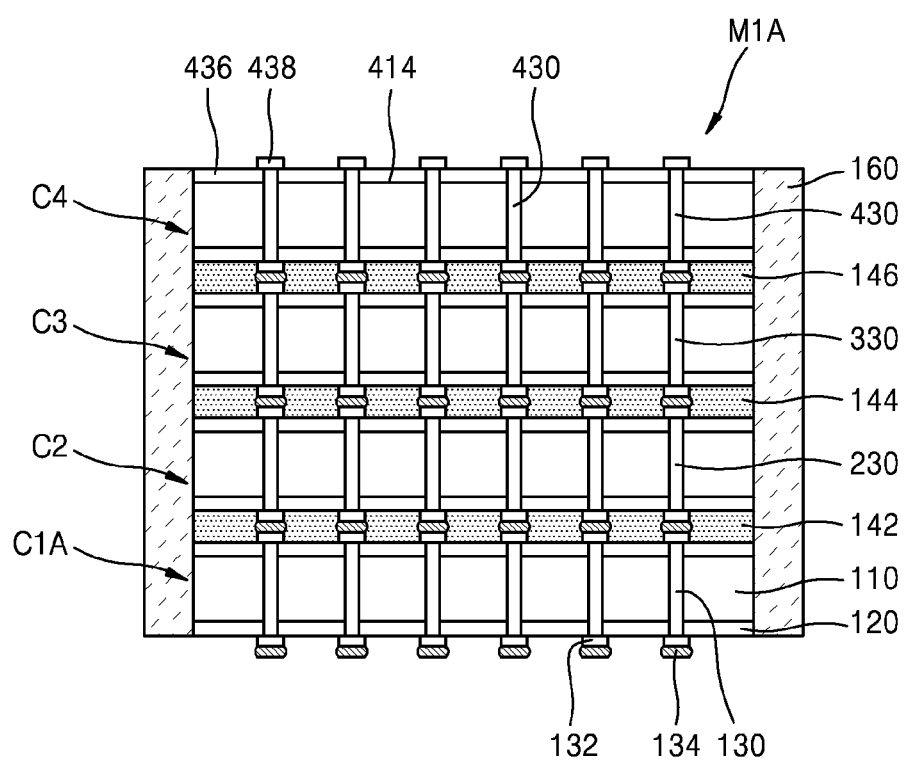

Referring to FIG. 17, a stacked structure of the first to fourth semiconductor chips C1A and C2 to C4 connected to each other by the first mold layer 160 may be diced along a second scribe lane SL2 (see FIG. 16), and thus, the stacked structure may be diced into a sub-package unit M1A including the first to fourth semiconductor chips C1A and C2 to C4 corresponding to each other. In addition, the carrier substrate 10 may be removed.

The sub-package unit M1A may include the first to fourth semiconductor chips C1A and C2 to C4 having the same horizontal cross-sectional area. The first mold layer 160 may surround the sides of the first to fourth semiconductor chips C1A and C2 to C4. A first connection bump 134 of the first semiconductor chip C1 may be exposed to the outside of the sub-package unit M1A without being covered by the first mold layer 160, and without being directly covered by any mold layer. If a fourth upper connection pad 438 of the fourth semiconductor chip C4 is omitted, a fourth TSV 430 may be exposed to the outside of the sub-package unit M1A without being covered by the first mold layer 160, and without being directly covered by any mold layer.

Figure 18:
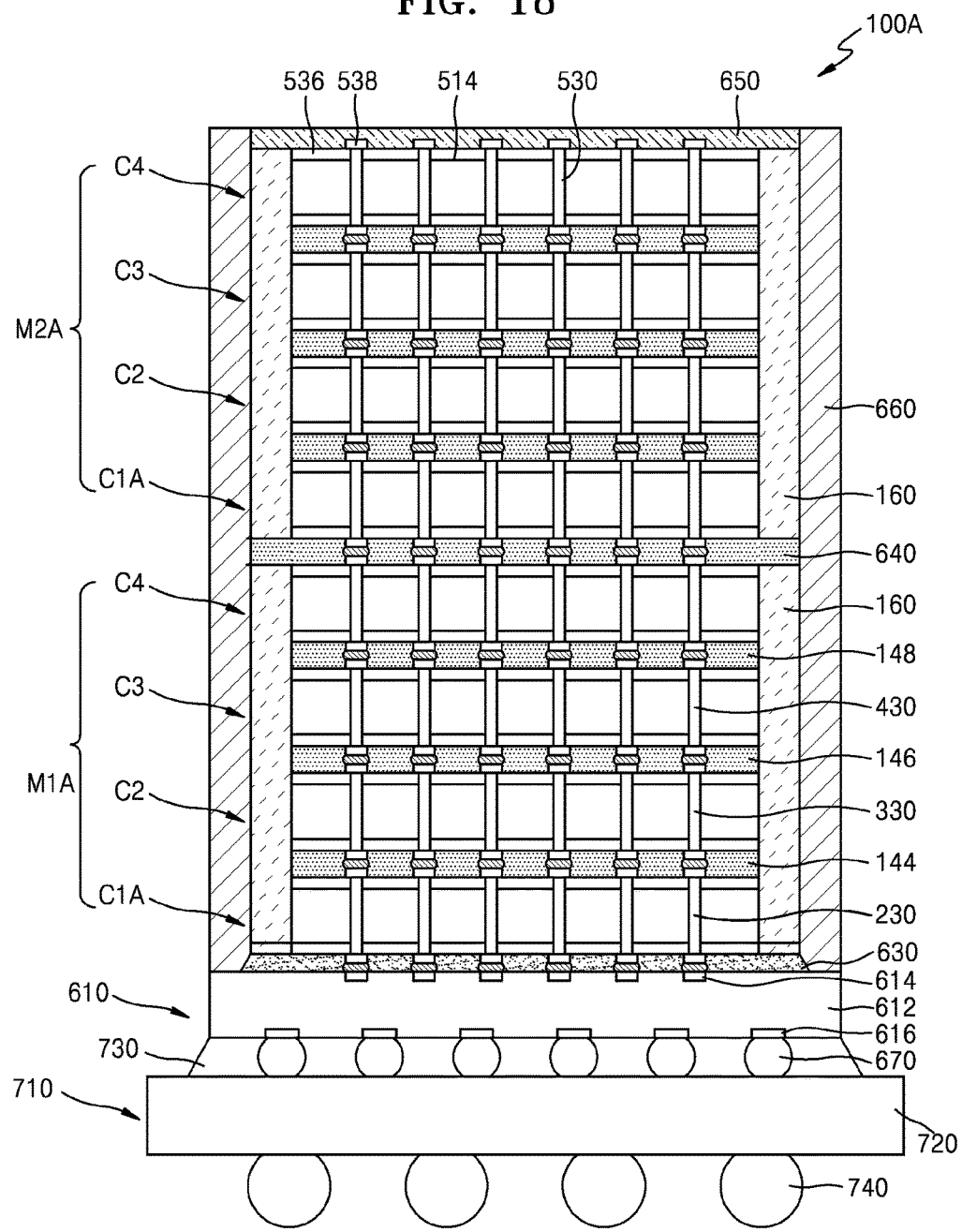

Subsequently, the semiconductor package 100A illustrated in FIG. 18 may be completely formed by the processes described above with reference to FIGS. 11 to 13.

The semiconductor package 100A may include sub-package units M1A and M2A which are vertically stacked, a fifth insulating material layer 640 disposed between the sub-package units M1A and M2A, and a second mold layer 660 surrounding sides of the sub-package units M1A and M2A and the fifth insulating material layer 640. A portion (for example, an edge of the fifth insulating material layer 640) of the fifth insulating material layer 640 may be disposed between a first mold layer 160 of the sub-package unit M1A and a first mold layer 160 of the sub-package unit M2A. The fifth insulating material layer 640 may have a horizontal cross-sectional area that is larger than those of the first to third insulating material layers 142, 144 and 146.

Since the first to fourth semiconductor chips C1A and C2 to C4 have the substantially same horizontal cross-sectional area and the sides of the first to fourth semiconductor chips C1A and C2 to C4 are surrounded by the first mold layer 160, the first to fourth semiconductor chips C1A and C2 to C4 may not contact the second mold layer 640.

According to the above-described method of manufacturing the semiconductor package 100A, the first to fourth semiconductor chips C1A and C2 to C4 included in the sub-package units M1A and M2A may be exposed to a high temperature process performed less times, and thus, thermal/physical damage which is applied to a connection bump or a connection portion between the connection bump and a TSV due to the high temperature process is reduced or prevented. Accordingly, the semiconductor package 100A has high reliability. Since semiconductor chips which are defective in electrical connection can be previously screened in a process of manufacturing the sub-package units M1A and M2A, a defect rate of the semiconductor package 100A is reduced.

Figure 19:
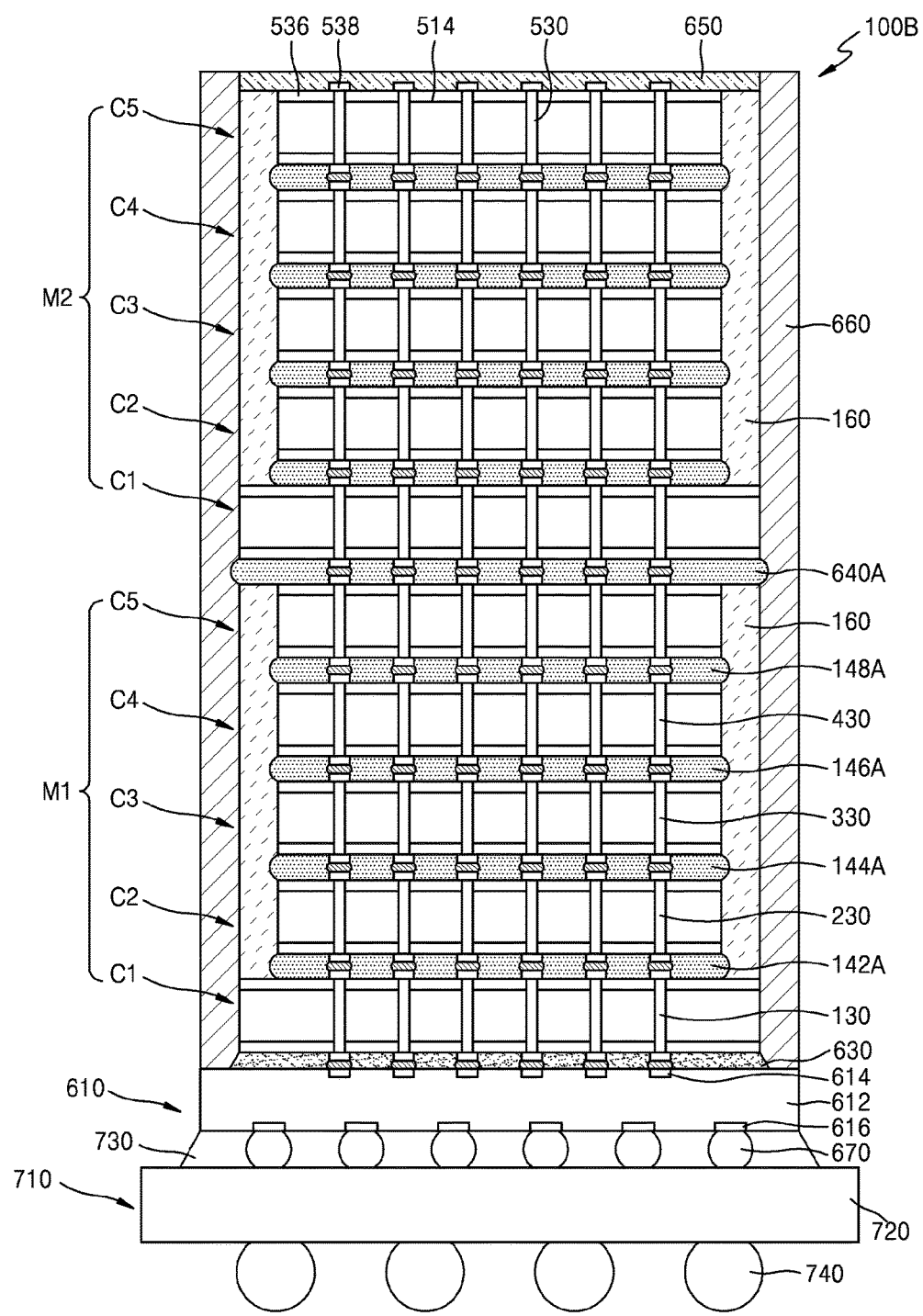
FIG. 19 is a cross-sectional view illustrating a semiconductor package according to exemplary embodiments.

FIG. 19 is a cross-sectional view illustrating a semiconductor package 100B according to exemplary embodiments. In FIG. 19, like reference numerals illustrated in FIGS. 1 to 18 refer to like elements. Except for first to fifth insulating material layers 142A, 144A, 146A, 148A and 640A, the semiconductor package 100B may be substantially the same as the semiconductor package 100 described above with reference to FIGS. 1 to 13.

Referring to FIG. 19, the first to fourth insulating material layers 142A, 144A, 146A and 148A may have a shape which convexly protrudes with respect to the second to fifth semiconductor chips C2 to C5. In exemplary embodiments, the first to fourth insulating material layers 142A, 144A, 146A and 148A may be formed by attaching an NCF. For example, in a process of manufacturing the sub-package units M1 and M2, pressure is applied while the second semiconductor chip C2 is being attached to be connected to the first TSV 130 of the first semiconductor chip C1, and thus, the first insulating material layer 142A may have a shape which convexly protrudes.

The fifth insulating material layer 640A may have a shape which convexly protrudes with respect to a side of the first semiconductor chip C1 or a side of the first mold layer 160. The fifth insulating material layer 640A may be formed by attaching an NCF. For example, the fifth insulating material layer 640A may be attached on the sub-package unit M1 in order for the first TSV 130 of the sub-package unit M2 to be electrically connected to the fifth TSV 530 of the sub-package unit M1, and the sub-package unit M2 may be attached on the fifth insulating material layer 640A (or the fifth insulating material layer 640A may be first attached on a bottom of the sub-package unit M2, and then, the sub-package unit M2 may be attached on the sub-package unit M1 in order for the fifth insulating material layer 640A to contact the sub-package unit M1). In this case, in the attach process, pressure may be applied to the fifth insulating material layer 640A, and thus, the fifth insulating material layer 640A may have a shape which convexly protrudes with respect to the side of the first semiconductor chip C1 or the side of the first mold layer 160.

In FIG. 19, an example where the fifth insulating material layer 640A has a convexly protruding shape is exemplarily illustrated, but the fifth insulating material layer 640A may be formed of an epoxy resin through a capillary under-fill process instead of attaching an NCF. In this case, the fifth insulating material layer 640A may have a shape which expands in a down direction in order for a lower width thereof to be wider than an upper width thereof.

Figure 20:
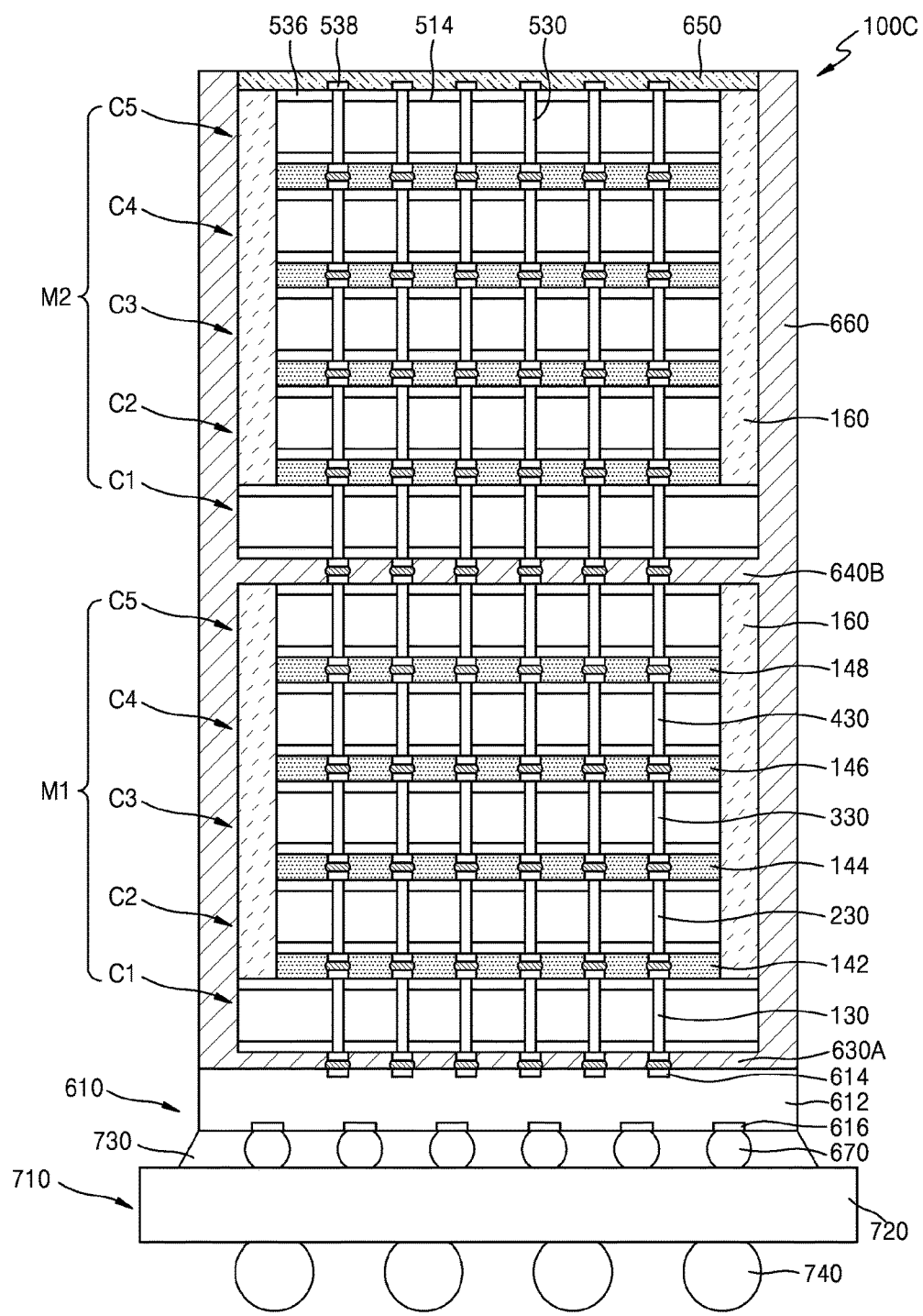
FIG. 20 is a cross-sectional view illustrating a semiconductor package according to exemplary embodiments.

FIG. 20 is a cross-sectional view illustrating a semiconductor package 100C according to exemplary embodiments. In FIG. 20, like reference numerals illustrated in FIGS. 1 to 19 refer to like elements. Except for a process of forming a fifth insulating material layer 640 and an under-fill material layer 630, the semiconductor package 100C may be substantially the same as the semiconductor package 100 described above with reference to FIGS. 1 to 13.

Referring to FIG. 20, a sub-package unit M1 may be attached on an interposer 610, and a sub-package unit M2 may be attached on the sub-package unit M1. Subsequently, the under-fill material layer 630A may be formed in a space between the interposer 610 and the sub-package unit M1 in a process of forming a second mold layer 660, and an under-fill material layer 640B may be formed in a space between the sub-package unit M1 and the sub-package unit M2. In exemplary embodiments, the under-fill material layers 630A and 640B may be a portion of the second mold layer 660 formed by a molded under-fill (MUF) process.

FIG. 21 is a cross-sectional view illustrating a semiconductor package 100D according to exemplary embodiments. In FIG. 21, like reference numerals illustrated in FIGS. 1 to 20 refer to like elements.

Referring to FIG. 21, sub-package units M1 and M2 may be stacked on a portion of an interposer 610, and a main semiconductor chip 800 may be disposed on another portion of the interposer 610.

The main semiconductor chip 800 may be, for example, a processor unit. The main semiconductor chip 800 may be, for example, a micro process unit (MPU) or a graphic processor unit (GPU). In some embodiments, the main semiconductor chip 800 may be a package (e.g., a KGP) of which a normal operation has been verified.

Main connection terminals 810 may be attached on a bottom of the main semiconductor chip 800. The main semiconductor chip 800 may be electrically connected to the interposer 610 through the main connection terminals 810. An under-fill material layer 820 surrounding the main connection terminals 810 may be further formed between the main semiconductor chip 800 and the interposer 610. The under-fill material layer 820 may include, for example, an epoxy resin. In some embodiments, the under-fill material layer 820 may be a portion of a second mold layer 660 formed by an MUF process.

In FIG. 21, a structure where two sub-package units M1 and M2 are stacked on a portion of the interposer 610 is disclosed, but the number of vertically stacked sub-package units M1 and M2 is not limited thereto. For example, three or four sub-package units M1 and M2 may be vertically stacked. Also, a stacked structure of vertically stacked sub-package units M1 and M2 may be additionally disposed on another portion of the interposer 610. For example, unlike the exemplarily illustrated in FIG. 21, the main semiconductor chip 800 may be disposed in a center of the interposer 610, and a structure where the sub-package units M1 and M2 are stacked may be provided in plurality near the main semiconductor chip 800 and may be spaced apart from each other (for example, may be disposed at a certain angle of 90 degrees or the like).

Moreover, in FIG. 21, the second mold layer 660 is exemplarily illustrated as being formed to a whole height or more of the main semiconductor chip 800 to cover a whole top and side of the main semiconductor chip 800, but the technical spirit of the inventive concept is not limited thereto. Unlike the exemplarily illustrated in FIG. 21, the second mold layer 660 may be formed to cover only a portion (for example, to a certain height from a bottom of the main semiconductor chip 800) of the side of the main semiconductor chip 800, or may be formed to entirely cover a top of both of the main semiconductor chip 800 (as shown) and the completed package unit that includes sub-package units M1 and M2.

In other embodiments, the main semiconductor chip 800 may include a TSV (not shown), and a stacked structure of the sub-package units M1 and M2 may be disposed on the main semiconductor chip 800. In this case, TSVs 130, 230, 330, 430, and 530 of first to fifth semiconductor chips C1 to C5 (see FIG. 10) may be electrically connected to the TSV of the main semiconductor chip 800 corresponding thereto, and the first to fifth semiconductor chips C1 to C5 may be electrically connected to an interposer 610 and/or a PCB 710 through the main connection terminals 810.

While various aspects of the inventive concept has been particularly shown and described with reference to embodiments thereof, it will be understood that various changes in form and details may be made therein without departing from the spirit and scope of the following claims.

What is claimed is:

1. A method of manufacturing a semiconductor package, comprising:
   providing a first sub-package unit including at least two first semiconductor chips, which are vertically stacked and include a top-most semiconductor chip of the first sub-package unit, and including a third semiconductor chip disposed under the at least two first semiconductor chips;
   providing a first mold layer surrounding side surfaces of the at least two first semiconductor chips; and
   providing a second sub-package unit including at least two second semiconductor chips, which are vertically stacked and include a top-most semiconductor chip of the second sub-package unit, and including a fourth semiconductor chip disposed under the at least two second semiconductor chips;
   providing a second mold layer that surrounds side surfaces of the at least two second semiconductor chips and is vertically spaced apart from the first mold layer;
   stacking the second sub-package unit on the first sub-package unit,
   wherein the at least two first semiconductor chips and the at least two second semiconductor chips each include a through substrate via (TSV), and
   wherein after the stacking, the top-most semiconductor chip of the first sub-package unit is electrically connected to a bottom-most semiconductor chip of the second sub-package unit, without a package substrate therebetween;
   providing a package substrate on which the at least two first semiconductor chips, the at least two second semiconductor chips, the third semiconductor chip, and the fourth semiconductor chip are vertically stacked to form a semiconductor package; and
   prior to the stacking, testing each of the first sub-package unit and the second sub-package unit.

2. The method claim 1, further comprising:
   providing an upper connection pad on a top surface of the top-most semiconductor chip of the second sub-package unit, the upper connection pad electrically connected to the TSV of the top-most semiconductor chip of the second sub-package unit.

3. The method of claim 1, further comprising:
   providing an insulating member on a top surface of the top-most semiconductor chip of the second sub-package unit.

4. The method of claim 1, further comprising:
   providing a first under-fill member between at least two of the first semiconductor chips of the first sub-package unit, and
   providing a second under-fill member between the at least two of the second semiconductor chips of the second sub-package unit.

5. The method of claim 4, further comprising:
   providing a third under-fill member between the first sub-package unit and the second sub-package unit, the third under-fill member contacting a top surface of the first mold layer and/or a bottom surface of the second mold layer.

6. The method of claim 5, wherein a portion of the third under-fill member is disposed between the first mold layer and the second mold layer.

7. The method of claim 5, wherein the third under-fill member has a horizontal cross-sectional area that is larger than a horizontal cross-sectional area of the first under-fill member or the second under-fill member.

8. The method of claim 1, wherein the at least two first semiconductor chips have the same horizontal cross-sectional area, and/or the at least two second semiconductor chips have the same horizontal cross-sectional area.

9. The method of claim 1,
   wherein the third semiconductor chip has a horizontal cross-sectional area that is larger than a horizontal cross-sectional area of each of the at least two first semiconductor chips, and the first mold layer is disposed on a portion of a top surface of the third semiconductor chip; and
   wherein the fourth semiconductor chip has a horizontal cross-sectional area that is larger than a horizontal cross-sectional area of each of the at least two second semiconductor chips, and the second mold layer is disposed on a portion of a top surface of the fourth semiconductor chip.

10. The method of claim 1, further comprising:
    providing a third mold layer surrounding a side surface of the first sub-package unit and a side surface of the second sub-package unit,
    wherein the third mold layer surrounds a side surface of the first mold layer and a side surface of the second mold layer.

11. The method of claim 10, further comprising:
    providing a first under-fill member between the first sub-package unit and the second sub-package unit,
    wherein the third mold layer surrounds a side surface of the first under-fill member.

12. The method of claim 1, further comprising:
testing the first sub-package unit using the TSV of the top-most semiconductor chip of the first sub-package unit, and testing- the second sub-package unit using the TSV of the top-most semiconductor chip of the second sub-package unit, prior to stacking the second sub-package unit on the first sub-package unit.

13. The method of claim 1, further comprising:
attaching the first sub-package unit to the second sub-package unit after each of the first sub-package unit and second sub-package unit have been formed by connecting top connection terminals of the first sub-package unit to bottom connection terminals of the second sub-package unit by solder bumps directly connected to respective ones of each of the top connection terminals and bottom connection terminals.

14. A method of manufacturing a semiconductor package, the method comprising:
providing a package substrate;
stacking a plurality of sub-package units on the package substrate along a direction vertical to a top surface of the package substrate by first stacking a first sub-package unit on the package substrate and subsequently stacking a second sub-package unit on the first sub-package unit,
wherein each of the plurality of sub-package units comprises:
a first buffer chip or logic chip, which is a bottom-most semiconductor chip of the sub-package unit;
a first memory chip disposed on the first buffer chip or logic chip;
a second memory chip disposed on the first memory chip and which is a top-most semiconductor chip of the sub-package unit; and
for each sub-package unit, a first mold layer surrounding a side surface of each of the first and second memory chips, wherein each of the first buffer chip, the first memory chip, and the second memory chip includes a through substrate via (TSV); and
performing a reflow process to directly electrically connect the first sub-package unit to the second sub-package unit.

15. The method of claim 14, wherein for each of the plurality of sub-package units, the first mold layer contacts a top surface of the first buffer chip and is not disposed on a side surface of the first buffer chip.

16. The method of claim 14, further comprising:
forming a second mold layer surrounding side surfaces of the plurality of sub-package units and contacting side surfaces of each first buffer chip.

17. A method of manufacturing a semiconductor package, the method comprising:
forming at least two partial package chip stacks, each partial package chip stack including at least two semiconductor chips each including a plurality of through substrate vias (TSVs), wherein for each partial package chip stack, one of the at least two semiconductor chips is a top-most semiconductor chip in the partial package chip stack, and including a first mold layer surrounding side surfaces of the at least two semiconductor chips;
sequentially mounting the at least two partial package chip stacks on a package substrate in a direction vertical to a top surface of the package substrate, such that the at least two partial package chip stacks include a first partial package chip stack and a second partial package chip stack directly connected to the first partial package chip stack, and wherein one of the at least two partial package chip stacks includes the top-most semiconductor chip of the semiconductor package; and
prior to the sequential mounting, testing at least the partial package chip stack that includes the top-most semiconductor chip of the semiconductor package, through the plurality of TSVs of that top-most semiconductor chip.

18. The method of claim 17, wherein
the forming of the at least two partial package chip stacks comprises, for each partial package chip stack, stacking one of the at least two semiconductor chips on another one of the at least two semiconductor chips with a first under-fill member therebetween,
the mounting of the at least two partial package chip stacks comprises stacking one of the at least two partial package chip stacks on another one of the at least two partial package chip stacks with a second under-fill member therebetween, and
a horizontal cross-sectional area of the second under-fill member is larger than a horizontal cross-sectional area of the first under-fill member.

19. The method of claim 18, wherein a portion of the second under-fill member is disposed between the first mold layers of the at least two partial package chip stacks.

20. The method of claim 17, wherein the testing is performed while the at least two partial package chip stacks are mounted on a carrier substrate and are horizontally disposed with respect to each other.

* * * * *